United States Patent
Soumpholphakdy et al.

(10) Patent No.: US 11,763,913 B2
(45) Date of Patent: Sep. 19, 2023

(54) AUTOMATED TESTING OF FUNCTIONALITY OF MULTIPLE NVRAM CARDS

(71) Applicant: EMC IP Holding Company LLC, Hopkinton, MA (US)

(72) Inventors: Steven Soumpholphakdy, Chicago, IL (US); Daniel Richard Thyken, Anoka, MN (US); Bradley Brian Bushard, Chaska, MN (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 179 days.

(21) Appl. No.: 17/373,648

(22) Filed: Jul. 12, 2021

(65) Prior Publication Data
US 2023/0018476 A1   Jan. 19, 2023

(51) Int. Cl.
G11C 29/00 (2006.01)
G11C 29/50 (2006.01)
G06F 1/3203 (2019.01)
G11C 14/00 (2006.01)

(52) U.S. Cl.
CPC ...... G11C 29/50004 (2013.01); G06F 1/3203 (2013.01); G11C 14/00 (2013.01); G11C 2029/5004 (2013.01)

(58) Field of Classification Search
CPC ...... G11C 29/50004; G11C 2029/5004; G11C 14/00; G06F 1/3203
See application file for complete search history.

(56) References Cited

U.S. PATENT DOCUMENTS

| 2015/0127999 | A1* | 5/2015 | Delpapa | G06F 1/28 714/721 |
| 2016/0118117 | A1* | 4/2016 | Park | G11C 13/0069 365/148 |
| 2020/0326853 | A1* | 10/2020 | Lee | G06F 3/0604 |

* cited by examiner

Primary Examiner — Christine T. Tu
(74) Attorney, Agent, or Firm — Amin, Turocy & Watson, LLP

(57) ABSTRACT

A system can validate multiple nonvolatile random-access memory (NVRAM) devices in parallel. The system can concurrently write a first data to a first volatile memory of a first NVRAM device and a second NVRAM device. The system can modify a first electrical power source that provides an electrical power output that is received by the first NVRAM device and is received by the second NVRAM device to modify a voltage of the electrical power from a first value to a second value to initiate the first NVRAM device and the second NVRAM device to respectively perform a vault. The system can reset the first electrical power source, causing the first NVRAM device and the second NVRAM device to reset. The system can verify whether the first NVRAM device and the second NVRAM device respectively store the first data in volatile memory subsequent to performing the resetting.

20 Claims, 12 Drawing Sheets

300

AUTOMATED TESTING OF FUNCTIONALITY OF MULTIPLE NVRAM CARDS

BACKGROUND

Random access memory (RAM) can comprise a type of computer memory that can store and retrieve computer data. Relative to a computer hard disk, RAM is generally faster, and more expensive for a given amount of storage. Some types of RAM can lose the data being stored when they lose power. Then, there are some types of computer storage (e.g., tape drives) that maintain data being stored when they lose power, but do not provide for random access of that data.

Nonvolatile random-access memory (NVRAM) can retain the data being stored even when power is lost, while providing for random access of the data being stored. Forms of computer memory that require power for storing data can be referred to as volatile memory. Forms of computer memory that can retain data during a power loss can be referred to as nonvolatile memory.

SUMMARY

The following presents a simplified summary of the disclosed subject matter in order to provide a basic understanding of some of the various embodiments. This summary is not an extensive overview of the various embodiments. It is intended neither to identify key or critical elements of the various embodiments nor to delineate the scope of the various embodiments. Its sole purpose is to present some concepts of the disclosure in a streamlined form as a prelude to the more detailed description that is presented later.

An example system can operate as follows. The system can write a first data to a first volatile memory of a first nonvolatile random-access memory (NVRAM) device concurrently with writing the first data to a second volatile memory of a second NVRAM device. The system can further modify a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to a nonvolatile storage. The system can further reset the first electrical power source, causing the first NVRAM device and the second NVRAM device to reset. The system can further verify whether the first NVRAM device stores the first data in volatile memory subsequent to performing the resetting concurrently with verifying whether the second NVRAM device stores the first data in volatile memory subsequent to performing the resetting.

An example method can comprise writing, by a system comprising a processor, data to a first volatile memory of a first nonvolatile random-access memory (NVRAM) device in parallel with writing the data to a second volatile memory of a second NVRAM device. The method can further comprise modifying, by the system, a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to a nonvolatile storage. The method can further comprise resetting, by the system, the first NVRAM device in parallel with resetting the second NVRAM device. The method can further comprise verifying, by the system, whether the first NVRAM device stores the data in volatile memory subsequent to performing the resetting in parallel with verifying whether the second NVRAM device stores the data in volatile memory subsequent to performing the resetting.

An example non-transitory computer-readable medium can comprise instructions that, in response to execution, cause a system comprising a processor to perform operations. These operations can comprise writing a data to a first volatile memory of a first nonvolatile random-access memory (NVRAM) device in parallel with writing the data to a second volatile memory of a second NVRAM device. The operations can further comprise modifying a first electrical power source that provides an electrical power output that is received by the first NVRAM device and is received by the second NVRAM device to set a first margin voltage of the electrical power to initiate the first NVRAM device and the second NVRAM device to respectively store the first data from the first volatile memory to a nonvolatile storage. The operations can further comprise resetting the first NVRAM device in parallel with resetting the second NVRAM device. The operations can further comprise verifying whether the first NVRAM device has restored first data associated with the first NVRAM device from the first vault operation subsequent to performing the resetting in parallel with verifying whether the second NVRAM device has restored second data associated with the second NVRAM device from the second vault operation.

BRIEF DESCRIPTION OF THE DRAWINGS

Numerous embodiments, objects, and advantages of the present embodiments will be apparent upon consideration of the following detailed description, taken in conjunction with the accompanying drawings, in which like reference characters refer to like parts throughout, and in which.

DETAILED DESCRIPTION

Overview

Figure 1:
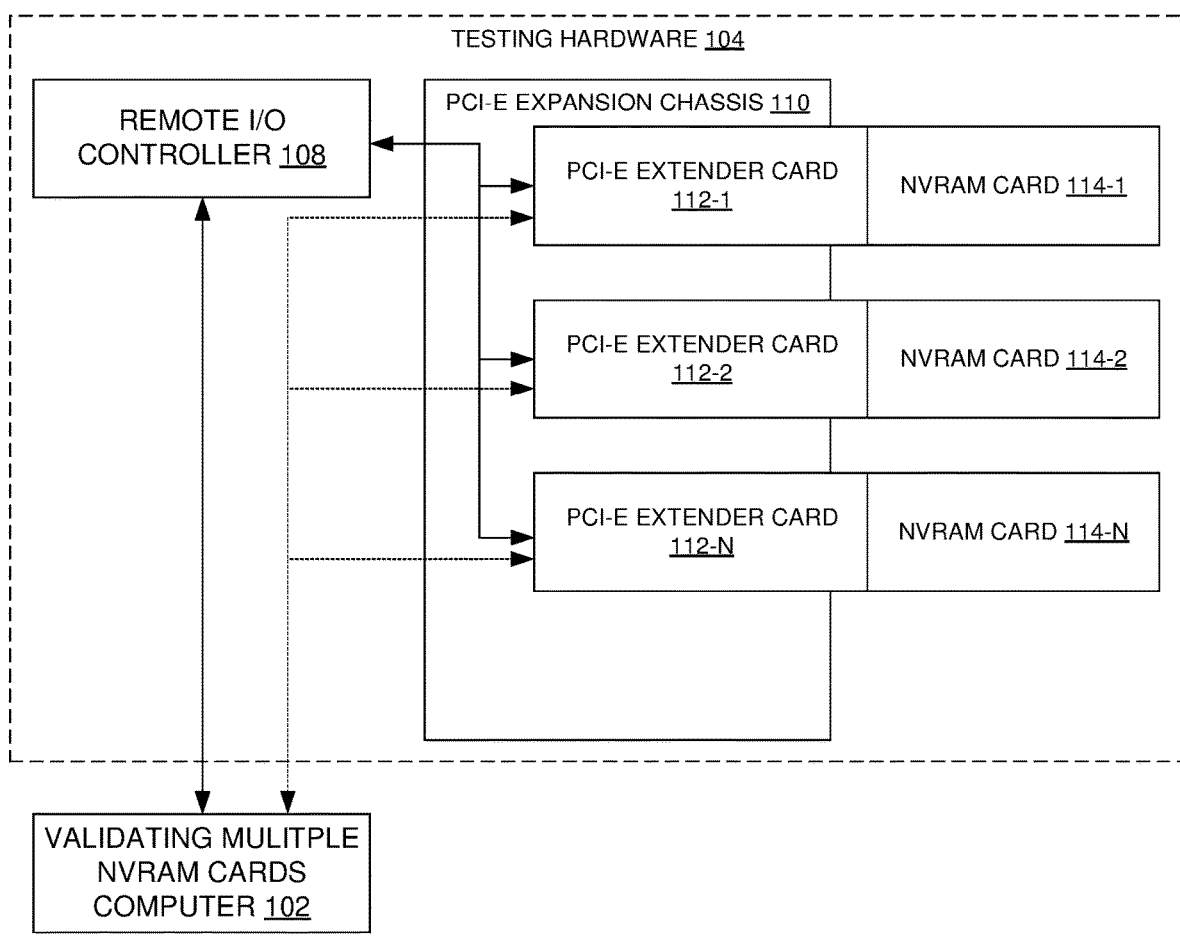
FIG. 1 illustrates an example system architecture that can facilitate automated testing of functionality of multiple NVRAM cards, in accordance with an embodiment of this disclosure.

In manufacturing computer systems that incorporate a NVRAM card (sometimes referred to as a NVRAM device), the functionality of the NVRAM card can be validated. This functionality can include meeting a minimum data throughput rate. Prior approaches to validating NVRAM cards involved validating NVRAM cards one at a time. These approaches could be time-consuming and limit a number of NVRAM cards that can be validated in a given time period, which can restrict how many computer systems incorporating these cards can be produced.

The present techniques can be implemented to validate NVRAM cards in parallel, and in contrast to the serial, one-at-a-time validation of prior approaches, can increase a throughput of validated NVRAM cards.

Other types of functionality of NVRAM cards that can be validated during manufacturing can include ensuring that read and write performance thresholds are met, an ability to save volatile memory contents to nonvolatile storage upon power loss, restoring nonvolatile storage contents to volatile memory upon power restoration, and programming firmware. Some of these functionalities of NVRAM cards can be challenging to test in automated fashion, much less for multiple cards in parallel.

To facilitate testing multiple NVRAM cards in this manner, a hardware system can be implemented to permit testing multiple cards at a time using a Peripheral Component Interconnect Express (PCI-e) expansion chassis, and to get and control state of certain hardware signals on a NVRAM card using a custom PCI-e extender card and remote I/O controller.

Programming firmware for a NVRAM card can be performed as follows. An NVRAM card can be put into a manufacturing mode in order to update its firmware (e.g., its superblock, (electrically erasable programmable read-only memory) EEPROM, and application). Doing so can involve grounding a pin of the NVRAM card, resetting a host system, and programming the NVRAM card. Resetting can comprise causing a device to start back up, and can omit having that device first go through a sequence to perform an orderly shutdown (such as by saving a state of the device to persistent storage). In some examples, resetting can be effectuated by power cycling a device (terminating power to the device, then resuming power to the device).

Using a remote I/O controller and a PCI-e extender, the manufacturing mode signal of a NVRAM card can be controlled, and a corresponding pin of the NVRAM card can be set into a state to permit programming Then, a component that programs the NVRAM cards can discover those NVRAM cards that are in this manufacturing mode and program the firmware for each card in parallel.

Testing a vault and restore capability of a NVRAM card can involve having control over a slot power of the NVRAM card. A vault operation can generally comprise an NVRAM card moving or copying data stored in volatile memory to nonvolatile storage of the NVRAM card. In some cases, an NVRAM card can initiate a vault operation in response to determining that the NVRAM card has lost power, or that a voltage supplied to the NVRAM card has dropped below a threshold value. A restore operation can generally comprise a NVRAM card moving or copying data stored in nonvolatile storage to volatile memory of the NVRAM card. In some cases, an NVRAM card can initiate a restore operation in response to determining that the NVRAM card gained (or regained) power, or that a voltage supplied to the NVRAM card has risen above a threshold value (which, in some examples, can be the same threshold value as used for a vault operation).

In some examples, a PCI-e expansion chassis can provide power to each of multiple NVRAM cards being validated in parallel with the chassis. Using a PCI-e extender card, source voltage to the card can be controlled, which can permit testing a card's vault and restore functionality. Using a remote I/O controller's input into the PCI-e extender card, a 3.3 volt (V) slot power provided to a NVRAM card can be controlled. After removing slot power, a digital output signal from the NVRAM card can be received that indicates that a vault-in-progress has been completed. Where all NVRAM cards being validated have completed a vault, then the cards can be tested to validate the cards' respective vault and restore operations.

When multiple NVRAM cards are being validated, some steps can be performed separately for each card, and in parallel. These steps can include writing data to the NVRAM card, and verifying vault and restore operations. In some examples, other steps can be performed once, which affects all NVRAM cards being validated. For example, the NVRAM cards can share one power signal. Where the voltage is margined from 5V to 3.3V, margining one voltage can affect all cards, since the cards share the one power source (in contrast to each card having a separate power source, where each separate power source is then individually margined from 5V to 3.3V). Once all cards being validated with the PCI-e expansion chassis vault, the cards can be polled, and after all cards have completed vaulting, then the cards can be reset.

Using the test harness, a card van be validated as operating properly when source voltage margin is set. Similar to a 3.3V margin, a source margin can be controlled with a remote I/O controller. This test can validate that a card performs as expected when it operates at approximately 3.1V as opposed to 5V. This validation test can simulate conditions where a NVRAM card operates on battery power. In this mode, an ON_BATTERY status bit of a NVRAM card can be checked, and read and write performance numbers can be validated as meeting minimum performance standards.

Some approaches to validating NVRAM cards can utilize a host system. In such examples, a number of cards that can be tested in parallel can be bound by a number of PCI-e slots available on a motherboard of the host system. Such an approach can also lack an ability to control slot power, and can lack an ability to automate firmware programming and vault and restore operations (as a result of an inability to control slot power). In contrast, the present techniques can provide for such automation and validation functionality.

A check using a mfg_check process can be used to test a NVRAM card. In some examples, a process can be effectuated with a script that comprises instructions to be executed by a processor. The mfg_check process can log test results to an appropriate log server. During an early initialization part of a mfg_check process on a NVRAM card, unique directory file paths can be set up on a log server based on each of the unit under test's serial numbers. Additionally, as part of early initialization, a local network can be setup using a network interface configuration process (e.g., an ifconfig process) for control of remote input/output (I/O) controllers.

After an early initialization stage of an mfg_check process on a NVRAM card, statistics can be gathered. Statistics to be gathered for a particular NVRAM card can include NVRAM-related system attributes (which can be syscytls such as attributes of the system kernel including version number, maximum limits, and security settings), and counters available via a nonvolatile memory express process (such as a nvmecontrol process). Once these statistics are gathered, identification tests can be run, followed by tests for each component on a NVRAM card.

The following components can be implemented as part of testing a NVRAM card.

An initial firmware burn to a NVRAM card can be done during user testing. In some examples, to perform an initial firmware burn, the NVRAM card can be set into a manufacturing node. Once in a manufacturing mode, a head node can be shut down and a chassis of the NVRAM card can be power cycled. On reset, a firmware burn can be completed using a nvmecontrol process. A firmware burn step can be performed during an early initialization part of an mfg_check process.

Using a chassis with NVRAM cards, multiple NVRAM cards can be processed in a batch mode. An mfg_check process can have an ability to burn firmware for multiple NVRAM cards at once. A manufacturing mode setting that is controlled by remote I/O can be a shared signal so that each card in the chassis can be set in that mode at the same time. Using a nvmecontrol process, the firmware for each card can be burned separately.

After an initial firmware burn, vital product data (VPD) can be entered for a NVRAM card. A VPD load can be completed during an early initialization part of an mfg_check process.

Parts of processing NVRAM cards can be performed in batch mode. For example, when multiple NVRAM cards are seated in a chassis, an mfg_check process can iterate through the cards, and prompt for a VPD to be entered.

In some examples, where a condition is reached that would normally cause a panic, and the condition is caused by something a NVRAM card could have done, rather than panicking, the card can be quarantined. When a NVRAM card is quarantined, access to the card can be lost. During initial and final passes of an mfg_check process, quarantined cards can be checked for.

In some examples, cards can also be quarantined during testing, and before each test is run, newly quarantined cards can be checked for. These quarantined cards can be marked as failed. Where a card is marked as quarantined during an initial pass of testing, it can be re-marked as quarantined during an early initialization part of testing on a final pass. A quarantine card check can be completed during an early initialization part of an mfg_check process.

An NVRAM identification test can be implemented to verify the identity of a NVRAM card. As described herein, in some examples, separate modules can be used to implement different functionality so that they can be performed on multiple NVRAM cards at the rate that a particular card is ready for the next functionality and without waiting on a different module to complete operating on a different card.

A NVRAM test module can do the following. The module can verify the presence of the card (e.g., verify that a known device location exists in a file system). The module can verify a PCI-e subsystem vendor to have a predetermined known value. The module can log not-and (NAND) flash information from the NVRAM card, including a vendor identifier for each of the NAND flash chips (where a vendor identifier is not provided, a flash type can be reported instead), a number of bad blocks for each of the NAND flash chips, a number of total blocks for each of the NAND flash chips, and a size of each of the NAND flash chips.

A nvmecontrol utility can be utilized to send test requests to firmware of a NVRAM card.

For testing lights (such as light emitting diodes (LEDs)), prior to burning a VPD onto a card, the LEDs on the NVRAM card can be verified to be functioning properly. This can be implemented with the following commands in a UNIX-type operating system: "mfg_check —newserial" and "nvmecontrol runbist –i 4–n <seconds>lnv <controller id>."

For testing read performance, kernel threads (e.g., kthreads) can be used. Similarly, for testing write performance, kthreads can be used.

Vault testing can be used to test NAND flash.

The following approach can be taken to test DRAM. Sectors of the DRAM can be scrubbed (write/read/verify), using copy data command (such as a dd command in a UNIX-type operating system).

An input power margin test can be implemented as follows. In a batch mode, a vault test can be broken into multiple modules to provide for synchronization across multiple NVRAM cards, and with using the remote I/O controllers.

A component can perform certain functions in a batch mode across multiple cards, and in some examples, each of the following functions can be implemented with a separate module. These functions can include performing setup tasks prior to margining a voltage at the common collector (VCCSRC), setting a VCCSRC margin bit, running tests while VCCSRC is margined, clearing a VCCSRC margin bit, and performing cleanup after a VCCSRC margin test. The component can also perform certain functions for a single card. These functions can include running a wrapper module that can run the functions that are run during batch mode. The component can be driven by remote I/O using a PCIe extender card to control a VCCSRC to a card.

In some examples, the component can perform the following operations. In some examples, the operations can be performed in the following order in which they are presented. The component can read a source voltage of the card and verify that it is 5V (+/–5%); set a source margin bit using a remote I/O controller, read a source voltage of the card and verify that it is 3.1V (+/–5%), read an ON-BATTERY status bit, run a kernel thread read performance test, run a kernel thread write performance test, and clearing a source margin bit using a controller.

A vault test can be performed as follows. For a batch mode, a vault test can be divided into multiple modules to provide for synchronization with using a remote I/O controller.

A set of modules can be used to perform the following operations in a batch mode. A first module can perform setup tasks prior to starting a vault. The first module can set a bit that stimulates a host power loss. A second module can poll a vault_status bit using a remote I/O controller until all vaults are complete. A third module can clear a bit that simulated the host power loss. A fourth module can run after reset to verify that the vault completed successfully.

The set of modules can also be used to perform the following operations for a single card. A fifth module can serve as a wrapper module that runs each of the modules that is run during batch mode.

Then, a full vault can be performed as follows. Random data can be written to a file, using a "dd /dev/random" command in a UNIX-type operating system. That file can be written to the card, using a "dd /dev/<device>" command A 3.3V margin can be set to initiate a vault. Then, it can be verified that a 3.3V voltage has dropped to 2.5V (+/−5%).

Waiting for a vault to complete can be performed as monitoring a vault complete signal using a remote I/O controller. Once a vault status signal transitions from True to False, the vault can be determined to be complete. Where a card does not complete vaulting within a predetermined amount of time (e.g., 5 minutes), the card can be determined to have failed testing. When a vault is deemed to be complete, the system can be reset.

A vault test can be verified as being performed successfully as follows. It can be verified that a vault restore occurred and was successful. Then, the contents of DRAM of a NVRAM card can be determined to match the file that was originally copied into the card (e.g., using a "dd /dev/<device>" operation).

Determining that NVRAM is ready can be performed with a module. This module can verify that a "NVRAM Ready" status bit has been set using a nvmecontrol command A final report module can operate as follows. Where a test is run in a batch mode, before completing a mfg_check, a final report can be made identifying cards that passed, failed, or were not tested. In addition to reporting these results to a logfile, a final report module can illuminate a light (e.g., a light emitting diode (LED)) of the extender card that identifies a status of a corresponding result for a NVRAM card that is coupled to the extender card.

A test PCIe extender card can permit testing certain functions of a NVRAM card. A RESET logic chain can be functionally tested for a NVRAM card, including recognizing a PCIe RESET_N signal as being high or low. A host PCIe 3.3v power can be tested as being recognized as greater than 3.0V or less than 3.0V (where less than 3.0V of the possible 3.3V is supplied). A NVRAM card can be tested to determine that it runs with its input power supply (VCCSRC) at standard rail voltage and at battery voltage, from 5.0V to 3.0V. The condition of "on battery power" can be verified as being recognized by the NVRAM card.

Furthermore, a test PCIe extender card can perform the following operations. The test PCIe extender card can recognize that a testable card is plugged into the test PCIe extender card. The test PCIe extender card can visually indicate a particular slot to an administrator of the test PCIe extender card. The test PCIe extender card can provide buffered versions of PCIe 3.3V power and VCCSRC voltage to be used to monitor tests of NVRAM cards. The test PCIe extender card can provide feedback to a test controller as to the status of a NVRAM vault operation. The test PCIe extender card can generate a VCCSRC power for a NVRAM card from PCIe slot 12V power source. The test PCIe extender card can provide for streamlined cable connections to a NVRAM card, which can lead to easier assembly and maintenance of a testing system. The test PCIe extender card can orient NVRAM cards in a proper physical position so that insertion and removal functions can be properly used. The test PCIe extender card can turn a VCCSRC supply for NVRAM cards on or off. This can be used for test or card swapping between tests.

As used herein, some operations can be referred to as being performed in "parallel" for multiple NVRAM cards. This can indicate that there is one operation performed that applies to each NVRAM card. For instance, a PCIe expansion chassis can provide power to each of the NVRAM cards, so power cycling the PCI-e expansion chassis (one operation) can cause each of the NVRAM cards to be power cycled. Certain other operations can be performed separately for each NVRAM card. That is, where there are seven NVRAM cards, seven instances of a given operation (e.g., writing data to the NVRAM card) can be performed—one instance of the operation for each card.

Example Architectures

FIG. 1 illustrates an example system architecture 100 that can facilitate automated testing of functionality of multiple NVRAM cards, in accordance with an embodiment of this disclosure.

System architecture 100 comprises validating multiple NVRAM cards computer 102, and testing hardware 104. Testing hardware 104, in turn, remote I/O controller 108, PCI-e expansion chassis 110, PCI-e extender card 112-1, PCI-e extender card 112-2, PCI-e extender card 112-N, NVRAM card 114-1, NVRAM card 114-2, and NVRAM card 114-N.

As depicted in system architecture 100, there are N number of PCI-e extender cards, and N number of NVRAM cards. Some examples described herein have a N of 7, and it can be appreciated that these techniques can be applied to other examples where N is a positive integer greater than 1.

Additionally, as depicted in system architecture 100, there are the same number of PCI-e extender cards and NVRAM cards. That is, each PCI-e extender card is coupled to a NVRAM card that is being tested. It can be appreciated that there can be examples where there are more PCI-e extender cards than NVRAM cards—that not all PCI-e extender cards are being utilized to test a NVRAM card. That is, there can be examples where there are X number of PCI-e extender cards and Y number of NVRAM cards, where X >Y.

Figure 4:
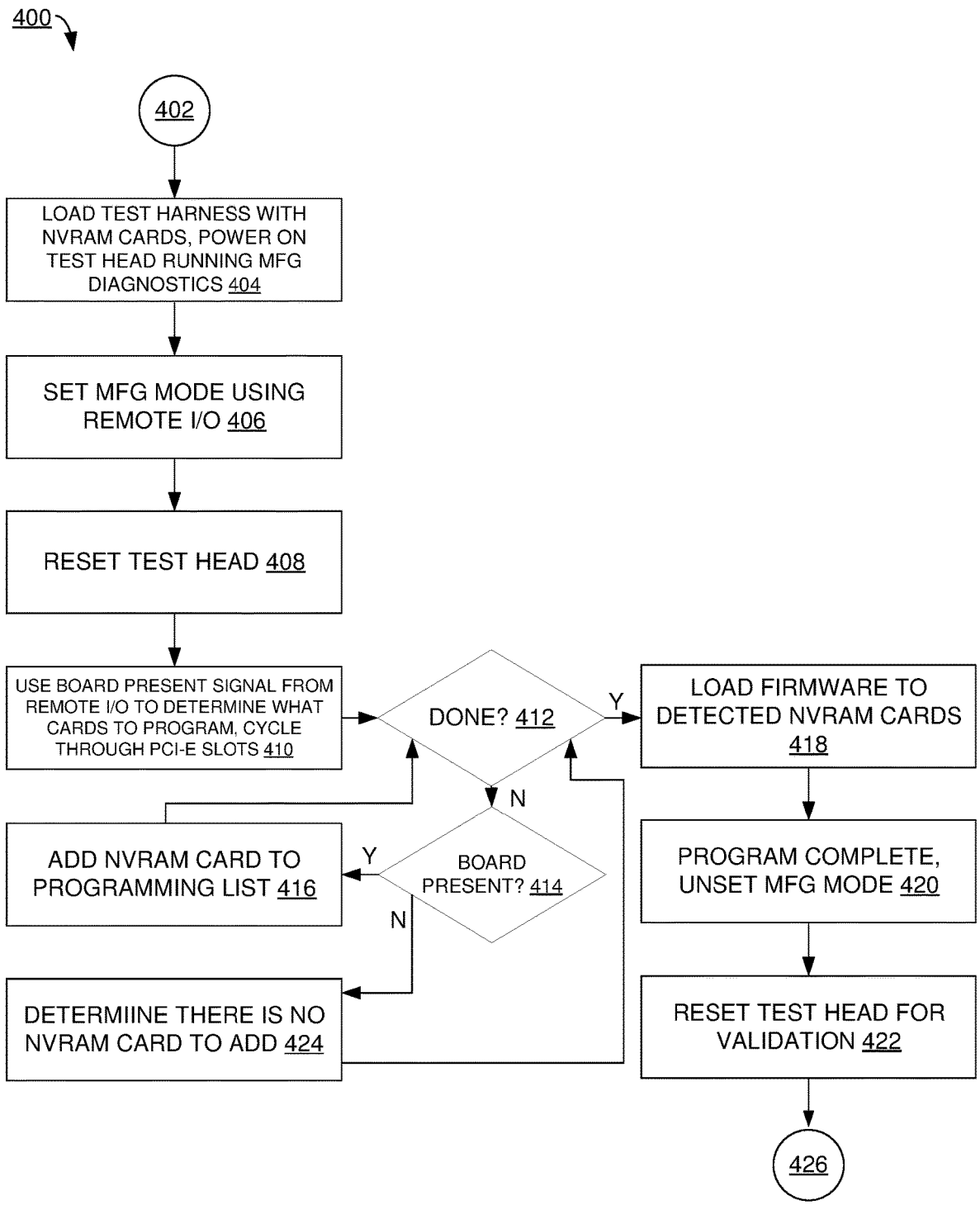
FIG. 4 illustrates an example process flow for firmware programming that can facilitate automated testing of functionality of multiple NVRAM cards, in accordance with an embodiment of this disclosure.
Figure 5:
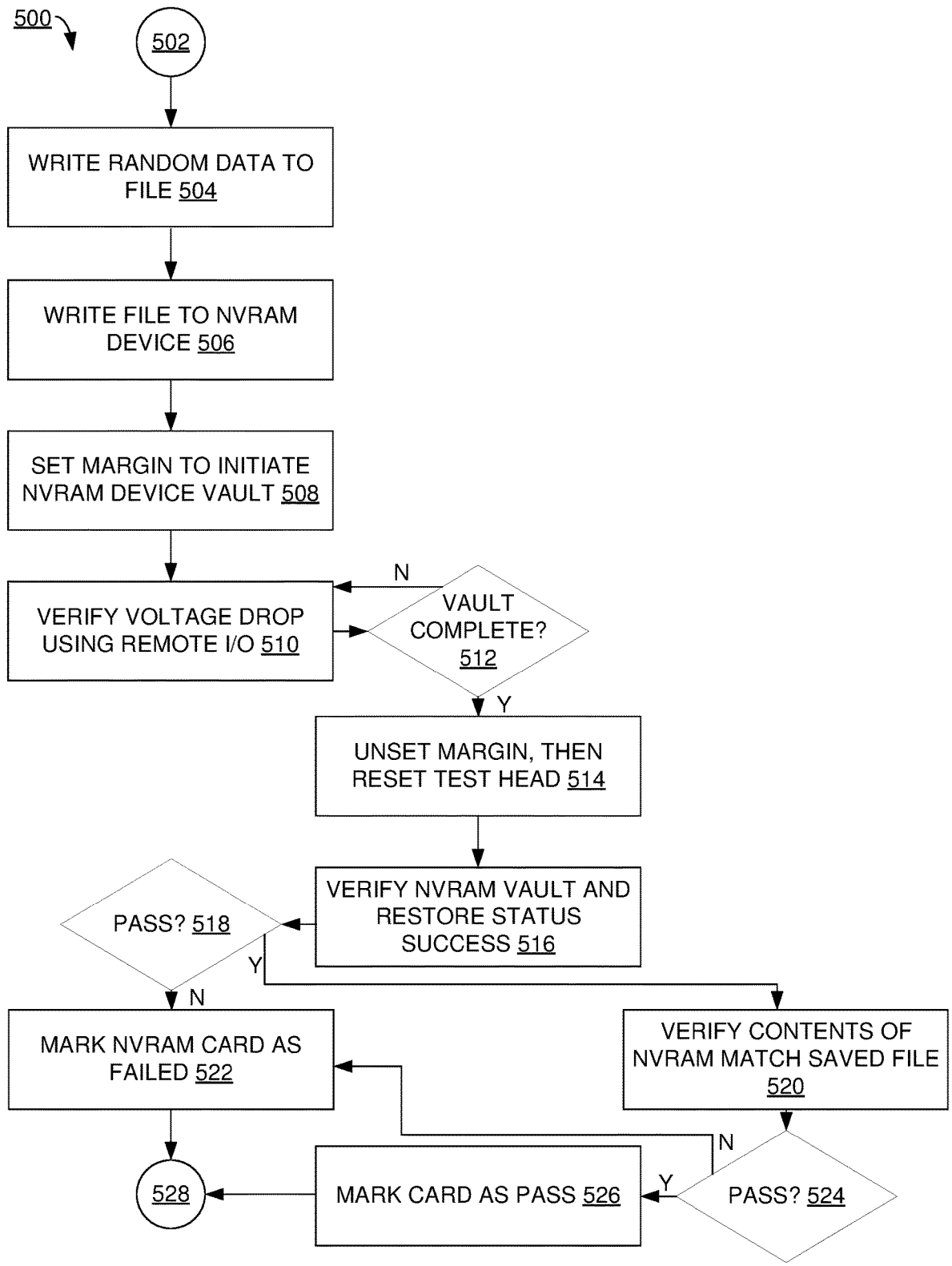
FIG. 5 illustrates an example process flow for vault and restore testing that can facilitate automated testing of functionality of multiple NVRAM cards, in accordance with an embodiment of this disclosure.
Figure 9:
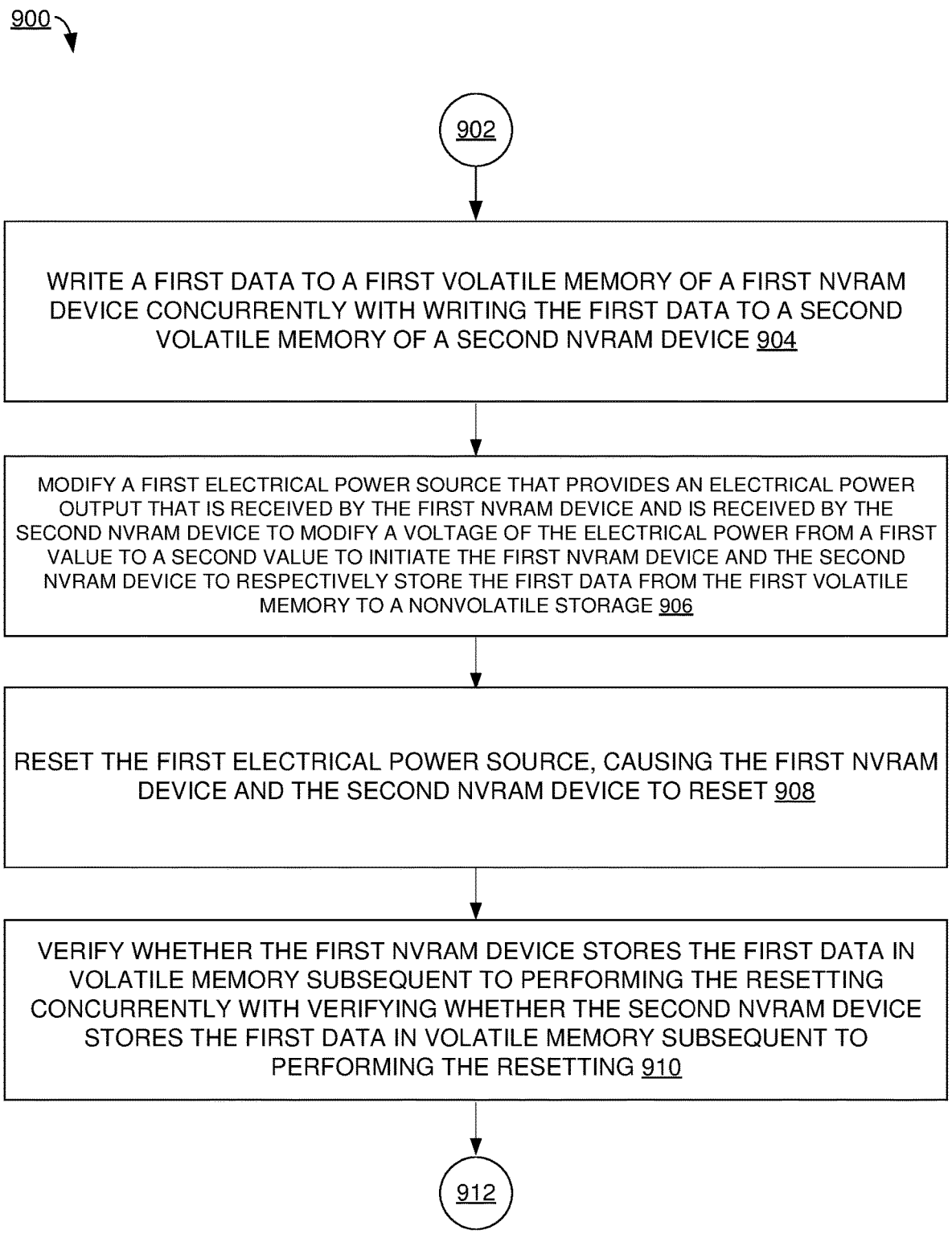
FIG. 9 illustrates an example process flow for automated testing of functionality of multiple NVRAM cards, in accordance with an embodiment of this disclosure.
Figure 10:
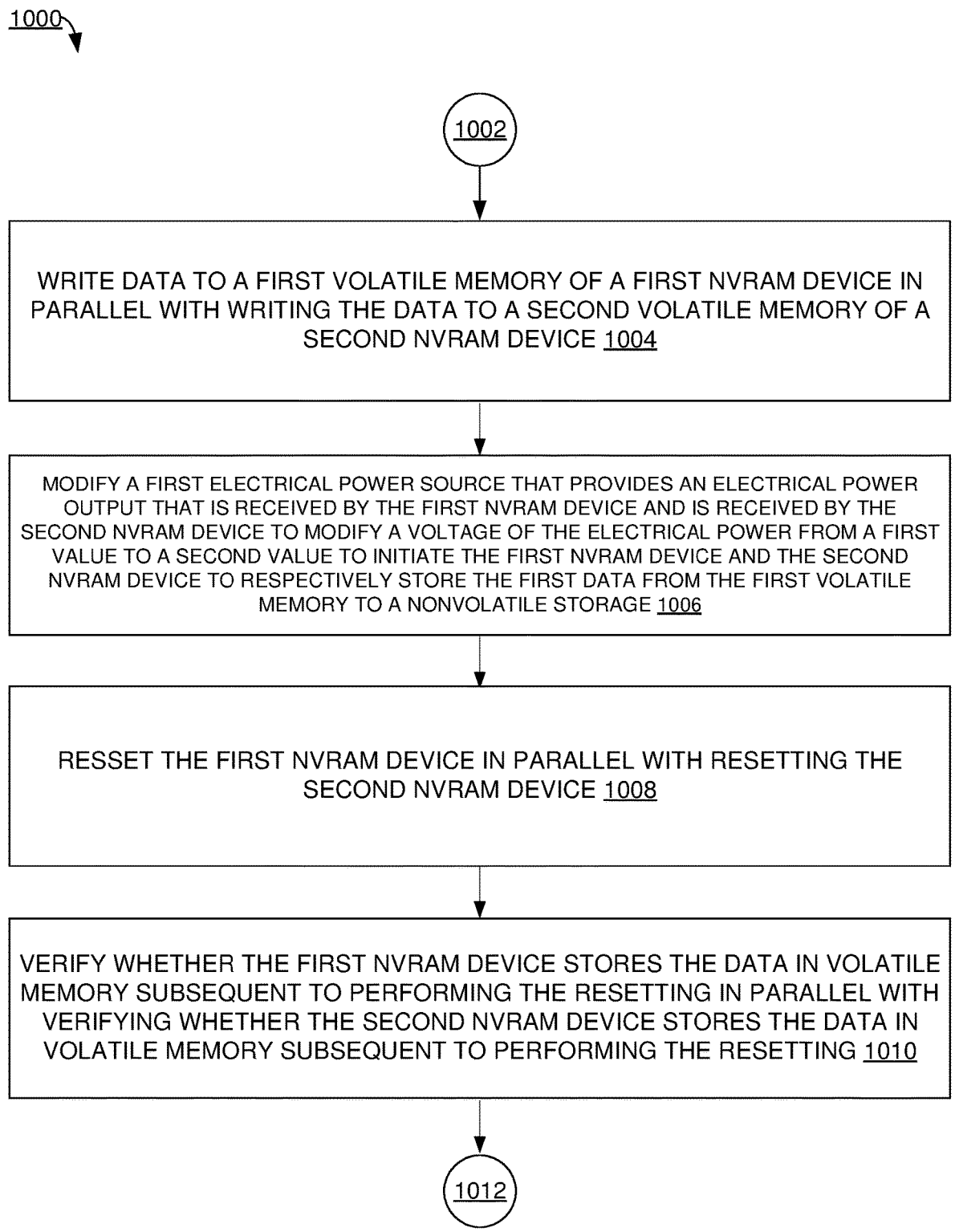
FIG. 10 illustrates another example process flow for automated testing of functionality of multiple NVRAM cards, in accordance with an embodiment of this disclosure.
Figure 11:
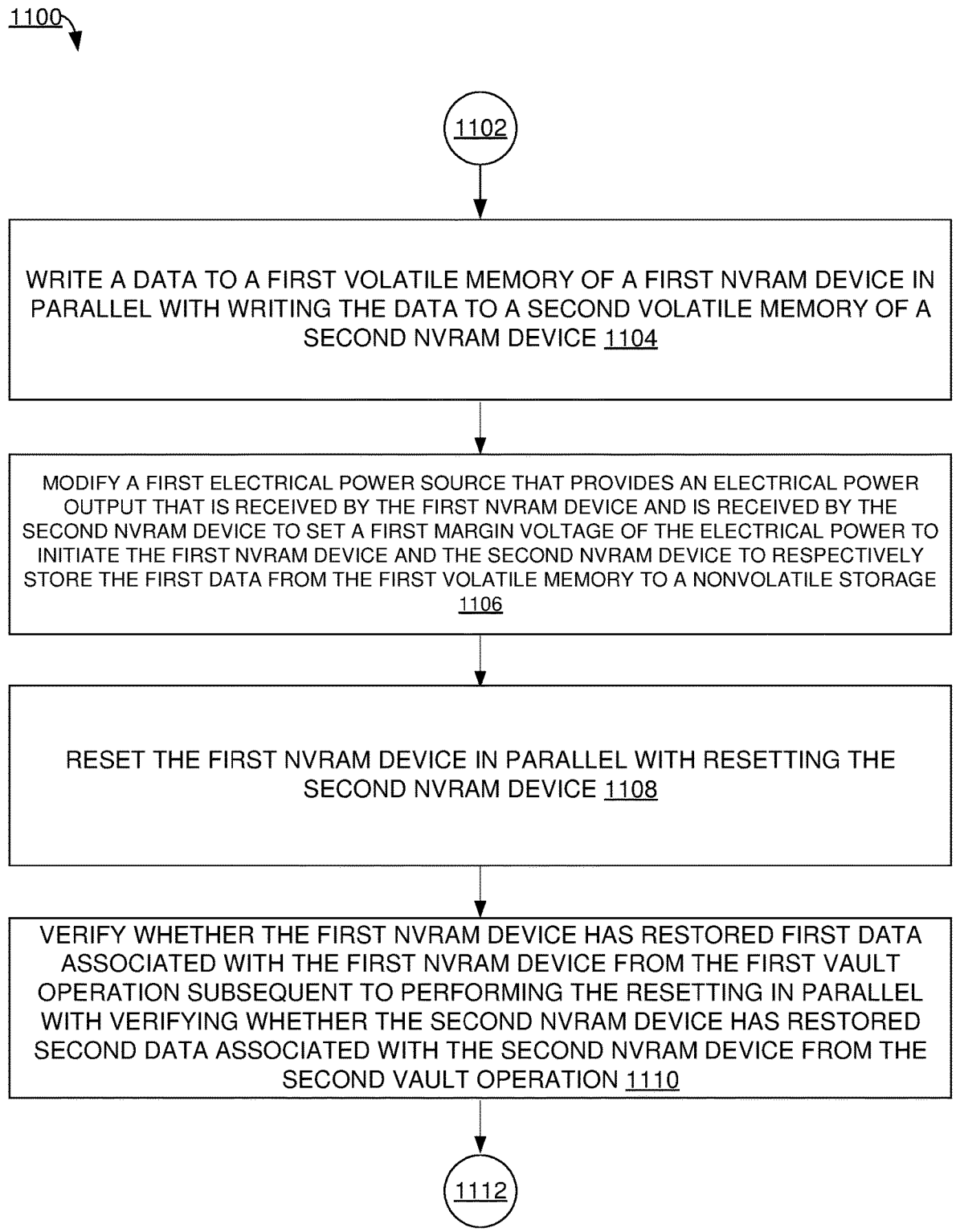
FIG. 11 illustrates another example process flow for automated testing of functionality of multiple NVRAM cards, in accordance with an embodiment of this disclosure.
Figure 12:
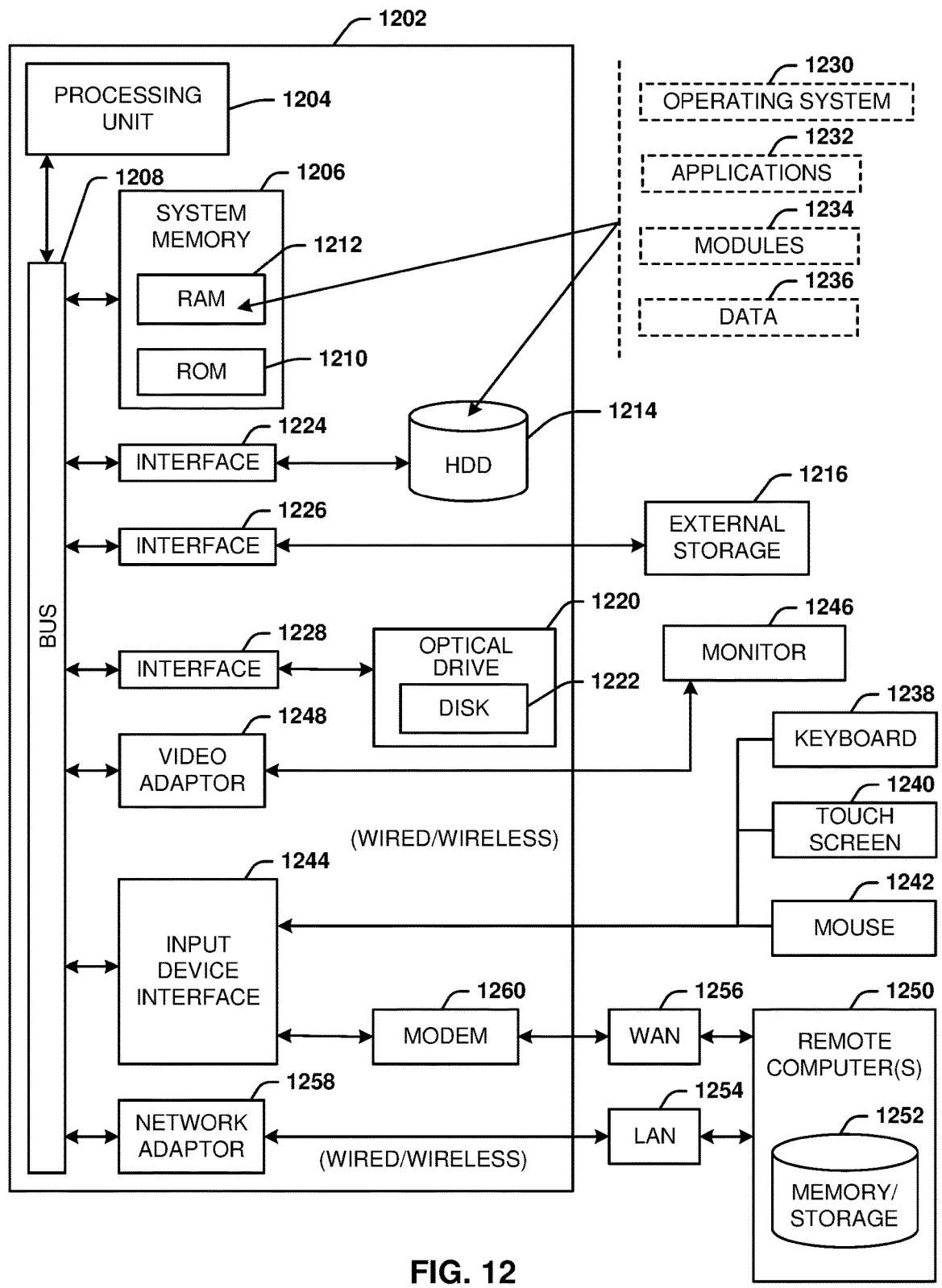
FIG. 12 illustrates an example block diagram of a computer operable to execute an embodiment of this disclosure.

In some examples, validating multiple NVRAM cards computer 102 (which can sometimes be referred to as a "test head") can be implemented with parts of computing environment 1200 of FIG. 12, and can implement parts of process flow 400 of FIG. 4, process flow 500 of FIG. 5, process flow 900 of FIG. 9, process flow 1000 of FIG. 10, and/or process flow 1100 of FIG. 11. In some examples, validating multiple NVRAM cards computer 102 can command digital outputs to an active or inactive state (such as through remote I/O controller 108) at appropriate times during a test cycle to cause operating environment changes for one or more NVRAM cards.

In other examples, validating multiple NVRAM cards computer 102 can communicate with NVRAM card 114-1, NVRAM card 114-2, and NVRAM card 114-N without the use of remote I/O controller 108. For example, to implement operation 512 of FIG. 5, validating multiple NVRAM cards computer 102 can check one or more known register values on a NVRAM card to determine if a vault was successful, and also that a restore was successful upon power being restored.

Figure 2:
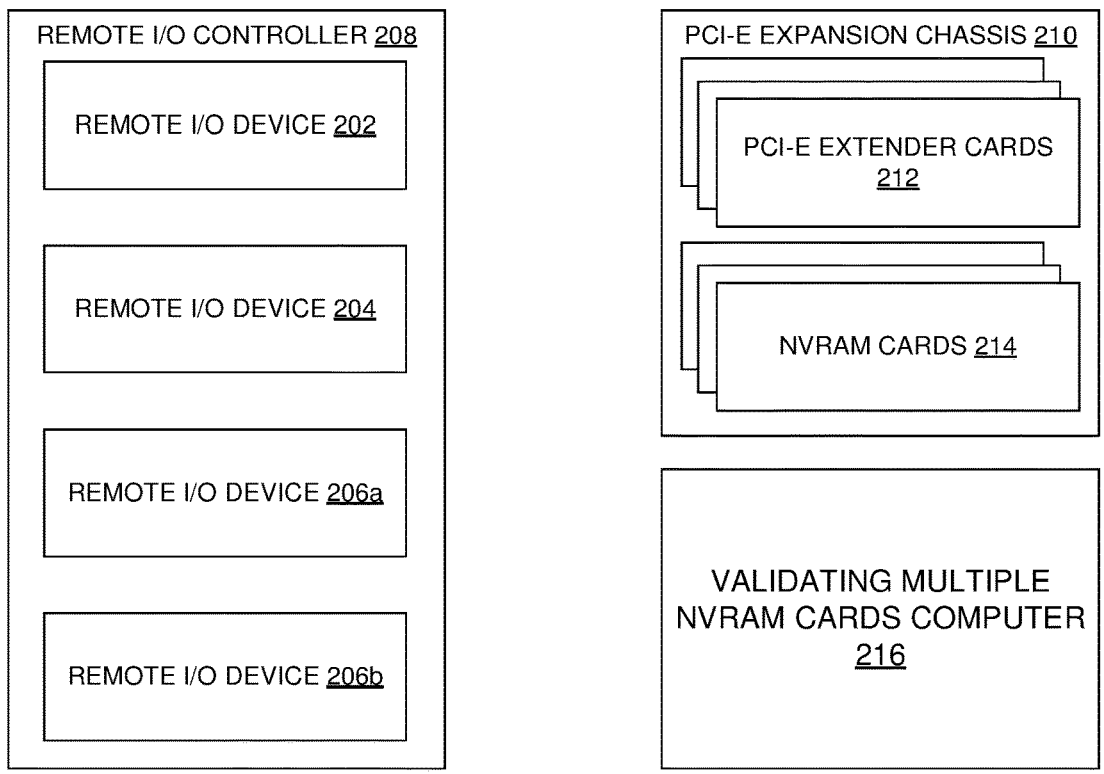
FIG. 2 illustrates another example system architecture for machine learning that can facilitate automated testing of functionality of multiple NVRAM cards, in accordance with an embodiment of this disclosure.

Remote I/O controller 108 can be similar to remote I/O controller 208 of FIG. 2, and can receive signals from and send signals to one or more NVRAM cards.

PCI-e expansion chassis 110 can provide power and a housing to PCI-e extender card 112-1, PCI-e extender card 112-2, PCI-e extender card 112-N, NVRAM card 114-1, NVRAM card 114-2, and NVRAM card 114-N.

PCI-e extender card 112-1, PCI-e extender card 112-2, and PCI-e extender card 112-N can be utilized to send and receive signals between remote I/O controller 108 and NVRAM card 114-1, NVRAM card 114-2, and NVRAM card 114-N.

Figure 3:
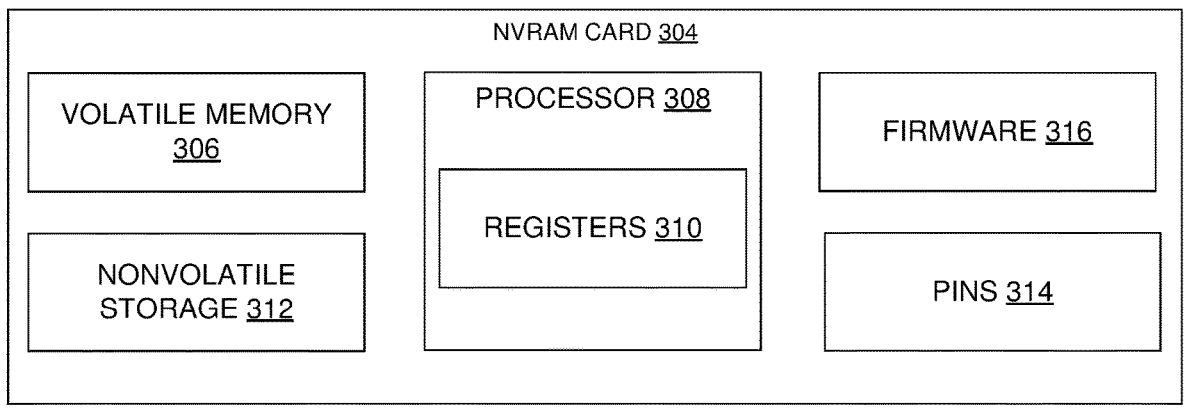
FIG. 3 illustrates another example system architecture for machine learning that can facilitate automated testing of functionality of multiple NVRAM cards, in accordance with an embodiment of this disclosure.
Figure 3:
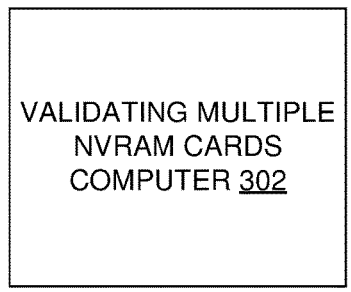

Each of NVRAM card 114-1, NVRAM card 114-2, and NVRAM card 114-N can be similar to NVRAM card 304 of FIG. 3.

FIG. 2 illustrates another example system architecture 200 for machine learning that can facilitate automated testing of functionality of multiple NVRAM cards, in accordance with an embodiment of this disclosure.

System architecture 200 comprises remote I/O controller 208, PCI-e expansion chassis 210, PCI-e extender cards 212, NVRAM cards 214, and validating multiple NVRAM cards computer 216. In turn, remote I/O controller 208 comprises remote I/O device 202, remote I/O device 204, remote I/O device 206a, and remote I/O device 206b.

In some examples, remote I/O controller 208 can be similar to remote I/O controller 108 of FIG. 1, PCI expansion chassis 210 can be similar to PCI-e expansion chassis 110, PCI-e extender cards 212 can comprise multiple cards that are each similar to PCI-e extender card 112-1, NVRAM cards 214 can comprise multiple cards that are each similar to NVRAM card 114-1, and validating multiple NVRAM cards computer 216 can be similar to validating multiple NVRAM cards computer 102.

The four remote I/O devices of remote I/O controller 208—remote I/O device 202, remote I/O device 204, remote I/O device 206a, and remote I/O device 206b—can be configured to work in concert to perform testing of multiple NVRAM PCI-e cards in parallel.

As depicted, remote I/O device 202 has 16 digital inputs, which can be utilized as follows (in a case where seven NVRAM cards can be coupled to a PCIe extender at once):

| Signal | I/O | Number of Connections | Controller Ports Used |
|---|---|---|---|
| Board Present | Digital Input | 7 (1 per card) | DI0-DI6 |
| Vault Status | Digital Input | 7 (1 per card) | DI7-DI13 |
| | | Total: 14 (2 per card) | |

As depicted, remote I/O device 204 has 16 digital outputs, which can be utilized as follows (in a case where seven NVRAM cards can be coupled to a PCIe extender at once):

| Signal | I/O | Number of Connections | Controller Ports Used |
|---|---|---|---|
| Slot Light Clock | Digital Output | 1 | DO0 |
| Slot Light Data Line | Digital Output | 1 | DO1 |
| PCIe Reset | Digital Output | 1 (Shared Between Cards) | DO2 |
| Vcc Source On | Digital Output | 1 (Shared Between Cards) | DO3 |
| Host 3.3 V Margin | Digital Output | 1 (Shared Between Cards) | DO4 |
| Host Source Margin | Digital Output | 1 (Shared Between Cards) | DO5 |
| Slot Light Address Lines | Digital Output | 3 | DO6-DO8 |
| Manufacturing Mode | Digital Output | 1 (Shared Between Cards) | DO9 |
| | | Total: 10 connections | |

As depicted, remote I/O device 206a has 8 analog inputs, which can be utilized as follows (in a case where seven NVRAM cards can be coupled to a PCIe extender at once):

| Signal | I/O | Number of Connections | Controller Ports Used |
|---|---|---|---|
| Host 3.3 V Sense | Analog Input | 7 (1 Per Card) | AI0-AI6 |
| | | Total: 7 (1 Per Card) | |

Similar to remote I/O device 206a, remote I/O device 206b can comprise a remote I/O device that has 8 analog inputs, and which can be utilized as follows (in a case where seven NVRAM cards can be coupled to a PCIe extender at once):

| Signal | I/O | Number of Connections | Controller Ports Used |
|---|---|---|---|
| Host Source Sense | Analog Input | 7 (1 Per Card) | AI0-AI6 |
| | | Total: 7 (1 Per Card) | |

The following signals can be transmitted between remote I/O controller 208 and PCI-e extender cards 212:

| Signal Name | Input/Output | Function |
|---|---|---|
| Board_Present_N | Controller Digital Input | Status Bit |
| Host_3v3_Sense | Controller Analog Input | A/D Input, Test Control/Calibration Check |
| VccSrc_Sense | Controller Analog Input | A/D Input, Test Control/Calibration Check |
| Vault_Status_N | Controller Digital Input | Status Bit |
| Slot_Light_Address | Controller Digital Output | Technician Indicator |
| Slot_Data_Line | Controller Digital Output | Technician Indicator |
| Slot_Light_Clk | Controller Digital Output | Technician Indicator |
| Control_PCIe_Reset_N | Controller Digital Output | Test Control |
| Host_3v3_Margin_N | Controller Digital Output | Test Control |
| VccSrc_On_N | Controller Digital Output | Test Control |
| VccSrc_Margin_N | Controller Digital Output | Test Control |
| Ground | | Current return path |

The following signals can be transmitted between one of PCI-e extender cards 212 and one of a NVRAM cards 214 that is coupled to the PCI-e extender card:

| Signal Name | Input/Output | Function |
|---|---|---|
| VccSrc (2) | Power Supply to NVRAM | Marginable from 5 v to 3.3 v |

-continued

| Signal Name | Input/Output | Function |
|---|---|---|
| Ground (2) | | Current return path |
| Vault_Complete | NVRAM Output | Test Control |
| Manufacturing Mode | NVRAM Input | Test Control |

PCI-e expansion chassis 210 can map the following devices or volumes to the following PCI addresses:

| Slot | Device | pci address |
|---|---|---|
| 1 | lnv0 | pci0:0:3:0:0 |
| 2 | lnv1 | pci0:0:4:0:0 |
| 3 | lnv2 | pci0:0:5:0:0 |
| 4 | lnv3 | pci0:0:6:0:0 |
| 5 | lnv5 | pci0:0:7:0:0 |
| 6 | lnv6 | pci0:0:8:0:0 |
| 7 | lnv7 | pci0:0:9:0:0 |

A remote I/O module that is controlled by validating multiple NVRAM cards computer 216, can be networked using a modbus protocol over a Transmission Control Protocol (TCP) data transmission protocol, and operate as a slave device.

Validating multiple NVRAM cards computer 216 can command digital outputs to an active or inactive state at appropriate times during a test cycle to cause operating environment changes for a NVRAM card of NVRAM cards 214. Remote I/O controller 208 can comprise multiple remote I/O devices (remote I/O device 202, remote I/O device 204, remote I/O device 206a, and remote I/O device 206b) that are configured to work in coordination.

Remote I/O controller 208 can control the following. Remote I/O controller 208 can control a power (3.3V) signal to each PCIe slot. Remote I/O controller 208 can reset to each PCIe slot. Remote I/O controller 208 can control a PCIe extender power supply to each VCCSRC margin. Remote I/O controller 208 can read a board present status bit.

Remote I/O controller 208 can set a slot LED of a PCIe extender (such as to indicate a failing or passing card that corresponds to that slow). Remote I/O controller 208 can issue a PCIe reset to reset a NVRAM card. Remote I/O controller 208 can set a host 3.3V margin. Remote I/O controller 208 can determine a host 3v3 sense, which can be an analog or digital input.

Remote I/O controller 208 can determine that a Vcc source is on. Remote I/O controller 208 can set a Vcc source margin. Remote I/O controller 208 can determine a Vcc source sense.

Remote I/O controller 208 can be implemented by utilizing a modbus data communications protocol library with an operating system that is used by validating multiple NVRAM cards computer 216.

FIG. 3 illustrates another example system architecture 300 for machine learning that can facilitate automated testing of functionality of multiple NVRAM cards, in accordance with an embodiment of this disclosure.

System architecture 300 comprises validating multiple NVRAM cards computer 302 and NVRAM card 304. In turn, NVRAM card 304 comprises volatile memory 306, processor 308, registers 310, nonvolatile storage 312, pins 314, and firmware 316.

In some examples, validating multiple NVRAM cards computer 302 can be similar to validating multiple NVRAM cards computer 102 of FIG. 1, and NVRAM card 304 can be similar to NVRAM card 114-a.

Volatile memory 306 can be computer memory, such as RAM, where the contents stored in the memory can be lost where power to NVRAM card 304 is lost. Nonvolatile storage 312 can be computer storage, such as flash storage, where the contents stored in the memory can be preserved where power to NVRAM card 304 is lost.

Processor 308 can comprise a computer processor similar to processing unit 1204 of FIG. 12. Processor 308 can comprise registers 310. Registers 310 can comprise computer storage accessible by processor 308 at a known location, where the presence of certain data in one or more of registers 310 can cause processor 308 to perform certain corresponding operations.

Pins 314 can comprise physical connectors of NVRAM card 304 via which data can be sent and received, and that can be used to communicatively couple NVRAM card 304 with a PCI-e extender card, such as PCI-e extender card 112-1 of FIG. 1.

Firmware 316 can comprise a form of computer storage that can store an operating system, or instructions for functioning, utilized by NVRAM card 304 and executed by processor 308.

When NVRAM card 304 has been receiving power above a threshold voltage, and then determines that received power has dropped below a threshold voltage, NVRAM card 304 can perform a vault operation. This can comprise copying contents of volatile memory 306 to nonvolatile storage 312 (where the data can be stored after power loss), and effectuated by processor 308.

When NVRAM card 304 has not been receiving power above (or power above a threshold voltage), and then determines that received power has risen above a threshold voltage, NVRAM card 304 can perform a restore operation. A restore operation can serve as a counterpart operation to a vault operation. An indication that a restore operation has been performed can be stored in a known location of registers 310, and can be accessed by validating multiple NVRAM cards computer 102. This restore operation can comprise copying contents of nonvolatile storage 312 to volatile memory 306 (where the data might not continue to be stored after a power loss), and effectuated by processor 308.

Example Process Flows

FIG. 4 illustrates an example process flow 400 for firmware programming that can facilitate automated testing of functionality of multiple NVRAM cards, in accordance with an embodiment of this disclosure. In some examples, one or more embodiments of process flow 400 can be implemented by validating multiple NVRAM cards computer 102 of FIG. 1, or computing environment 1200 of FIG. 12.

It can be appreciated that the operating procedures of process flow 400 are example operating procedures, and that there can be embodiments that implement more or fewer operating procedures than are depicted, or that implement the depicted operating procedures in a different order than as depicted. In some examples, process flow 400 can be implemented in conjunction with one or more embodiments of one or more of process flow 500 of FIG. 5, process flow 900 of FIG. 9, process flow 1000 of FIG. 10, and/or process flow 1100 of FIG. 11.

Process flow 400 begins with 402, and moves to operation 404. Operation 404 depicts loading a test harness with NVRAM cards, and powering on the test head running manufacturing diagnostics. This can comprise loading NVRAM cards 114-1 to 114-N of FIG. 1 in a test harness that comprises PCI-e expansion chassis 110 and PCI-e extender cards 112-1 to 112-N. This can also comprise powering on validating multiple NVRAM cards computer 102. After operation 404, process flow 400 moves to operation 406.

Operation 406 depicts setting a manufacturing mode using remote I/O. This can comprise setting a manufacturing mode of the NVRAM cards of operation 404 using one or more remote I/O functions of remote I/O controller 108 of FIG. 1. After operation 406, process flow 400 moves to operation 408.

Operation 408 depicts resetting a test head. This can comprise cycling power to validating multiple NVRAM cards computer 102 of FIG. 1, to cause the computer to reset when power is restored. After operation 408, process flow 400 moves to operation 410.

Operation 410 depicts using a board present signal from remote I/O to determine what cards to program, and cycle through PCI-e slots. In some examples, a NVRAM card can output a "board present" signal, and the presence or absence of this signal can be determined by a remote I/O controller using remote I/O functions. A card that is coupled to a particular PCI-e extender slot can provide such a board present signal to a known location that is determinable by a remote I/O controller. The absence of such a signal at the known location can be an indication that there is no board present signal.

The presence of a board present signal can indicate that a corresponding NVRAM card is present and to be programmed with firmware. After operation 410, process flow 400 moves to operation 412.

Operation 412 is reached from operation 410, from operation 416, or from operation 424. Operation 412 depicts determining whether all cards have been evaluated. In some examples, there can be a predetermined number of NVRAM cards coupled to a PCI expansion chassis. In such examples, each slot of a PCI expansion chassis can be evaluated in turn for the presence or absence of a NVRAM card. Where all slots have been evaluated, it can be determined that all cards have been evaluated.

Where it is determined in operation 412 that not all cards have been evaluated, process flow 400 moves to operation 414. Instead, where it is determined in operation 412 that all cards have been evaluated, process flow 400 moves to operation 418.

Operation 414 is reached from operation 412 where it is determined that not all cards have been evaluated. Operation 414 depicts determining whether there is a board present signal. This can be a board present signal for a NVRAM card that corresponds to a particular slot of a PCI expansion chassis, and received at a remote I/O controller using a remote I/O function. Where it is determined in operation 414 that there is a board present signal, process flow 400 moves to operation 416. Where it is determined in operation 414 that there is not a board present signal, process flow 400 moves to operation 424.

Operation 416 is reached from operation 414 where it is determined that there is a board present signal. Operation 416 depicts adding the NVRAM card to the programming list. This can comprise maintaining a list of NVRAM cards that are present (or slots in which a NVRAM card is present) in a computer memory, where this list can later be used to determine for which NVRAM cards to program a firmware. After operation 416, process flow 400 returns to operation 412.

Operation 418 is reached from operation 412 where it is determined that all cards have been evaluated. Operation 418 depicts loading firmware to detected NVRAM cards. These detected NVRAM cards can correspond to the list of NVRAM cards determined in operation 416. Loading the firmware can comprise validating multiple NVRAM cards computer 102 issuing instructions to a nonvolatile memory express process (such as a nvmecontrol process) to program a firmware of one or more NVRAM cards with a firmware stored by validating multiple NVRAM cards computer 102. After operation 418, process flow 400 moves to operation 420.

Operation 420 depicts where programming is complete, unsetting a manufacturing mode. Programming can be complete where a firmware of each detected NVRAM card has been programmed A remote I/O controller can utilize a remote I/O function to unset a manufacturing mode of each of these programmed NVRAM cards. After operation 420, process flow 400 moves to operation 422.

Operation 422 depicts resetting the test head for validation. This can comprise power cycling the test head, where the test head will reset once it regains power. The validation can be a validation of functionality of the programmed NVRAM cards, and can be performed in a similar manner as depicted with respect to FIG. 5.

After operation 422, process flow 400 moves to 426, where process flow 400 ends.

Operation 424 is reached from operation 414 where it is determined that there is not a board present signal. Operation 424 depicts determining that there is no NVRAM card to add. That is, the absence of a NVRAM card in a particular slot can have been determined, and as a result, it is affirmatively determined that there is not a NVRAM card to add to a programming list, such as the programming list of operation 416. After operation 424, process flow 400 returns to operation 412.

FIG. 5 illustrates an example process flow 500 for vault and restore testing that can facilitate automated testing of functionality of multiple NVRAM cards, in accordance with an embodiment of this disclosure. In some examples, one or more embodiments of process flow 500 can be implemented by validating multiple NVRAM cards computer 102 of FIG. 1, or computing environment 1200 of FIG. 12.

It can be appreciated that the operating procedures of process flow 500 are example operating procedures, and that there can be embodiments that implement more or fewer operating procedures than are depicted, or that implement the depicted operating procedures in a different order than as depicted. In some examples, process flow 500 can be implemented in conjunction with one or more embodiments of one or more of process flow 400 of FIG. 4, process flow 900 of FIG. 9, process flow 1000 of FIG. 10, and/or process flow 1100 of FIG. 11.

Process flow 500 begins with 502, and moves to operation 504. Operation 504 depicts writing random data to a file. In some examples, this random data can be created and written using a "dd" operation of a UNIX-type operating system. After operation 504, process flow 500 moves to operation 506.

Operation 506 depicts writing the file to a NVRAM device. This can comprise an operating system of validating multiple NVRAM cards computer 102 of FIG. 1 writing the data of the file to the NVRAM device, where the NVRAM device stores the data in a RAM (e.g., volatile memory 306 of FIG. 3). In some examples, testing hardware, such as validating multiple NVRAM cards computer 102 of FIG. 1, can directly access NVRAM cards for some operations without going through remote I/O controller 108. After operation 506, process flow 500 moves to operation 508.

Operation 508 depicts setting a margin to initiate a NVRAM device vault. This can comprise reducing a voltage supplied to the NVRAM card, where, upon determining that a received voltage has fallen below a predetermined threshold value, the NVRAM card will start performing a vault operation. A vault operation can comprise transferring data stored in RAM (e.g., volatile memory 306 of FIG. 3) to nonvolatile storage (e.g., nonvolatile storage 312 of FIG. 3).

In some examples, data stored in RAM can be lost upon a NVRAM device losing power, whereas data stored in nonvolatile storage can be preserved upon a NVRAM device losing power. After operation 508, process flow 500 moves to operation 510.

Operation 510 is reached from operation 508, or from operation 512 where it is determined that a vault is not complete. Operation 510 depicts verifying a voltage drop using remote I/O. That is, remote I/O controller 108 can use a remote I/O function to determine a voltage supplied to the NVRAM card, and verify that this voltage has dropped sufficiently low to cause the NVRAM card to initiate a vault operation. After operation 510, process flow 500 moves to operation 512.

Operation 512 depicts determining whether a vault is complete. In some examples, a NVRAM card can output a signal indicating that a vault is complete, and this can be received by remote I/O controller 108 at a known location. In such examples, operation 512 can comprise the remote I/O controller determining whether or not this signal has been received.

After determining that a vault is complete, and in some examples, validating multiple NVRAM cards computer 102 of FIG. 1 can check one or more known register values on the NVRAM card to determine if a vault was successful, and also that a restore was successful upon power being restored. These register values can be checked before validating stored NVRAM contents to determine that the stored contents match a file that was originally written to the NVRAM card.

Where it is determined in operation 512 that a vault is complete, process flow 500 moves to operation 514. Instead, where it is determined in operation 512 that a vault is incomplete, process flow 500 returns to operation 510.

Operation 514 is reached from operation 512 where it is determined in operation 512 that a vault is complete. Operation 514 depicts unsetting a margin, then resetting a test head. Unsetting a margin can comprise unsetting the margin voltage that is set in operation 508, by returning the voltage to the value it had prior to implementing operation 508.

Resetting the test head can comprise power cycling (e.g., terminating and then restoring power supplied to) validating multiple NVRAM cards computer 102, where validating multiple NVRAM cards computer 102 will reset when it regains power. After operation 514, process flow 500 moves to operation 516.

Operation 516 depicts verifying that a NVRAM vault and restore status is successful. In some examples, a NVRAM card can output a signal indicating that both a vault and restore are complete, and this can be received by remote I/O controller 108 at a known location. In such examples, operation 512 can comprise the remote I/O controller determining whether or not this signal or signals has been received. After operation 516, process flow 500 moves to operation 518.

Operation 518 depicts determining whether the vault and restore status passes. This can comprise a remote I/O controller checking for a received signal from the NVRAM card indicating that both a vault and restore are complete, within a predetermined amount of time.

Where it is determined in operation 518 that the vault and restore status passes, process flow 500 moves to operation 520. Instead, where it is determined in operation 518 that the vault and restore status fails, process flow 500 moves to operation 522.

Operation 520 is reached from operation 518 where it is that the vault and restore status passes. Operation 520 depicts verifying whether the contents of the NVRAM match the saved file. This can comprise validating multiple NVRAM cards computer 102 of FIG. 1 reading contents of volatile memory of the NVRAM card and comparing them to the file of operation 504.

After operation 520, process flow 500 moves to operation 524.

Operation 522 is reached from operation 520 where it is determined that the vault and restore status fails, or from operation 524 where it is determined that verifying whether the contents of the NVRAM match the saved file failed. Operation 522 depicts marking the NVRAM card as failed. This can comprise a remote I/O controller lighting up a light in a PCI expansion chassis that indicates that the card failed (e.g., a red light for failed, in contrast to a green light for passed).

In some examples, this can comprise storing an indication that the NVRAM card failed in a computer memory of validating multiple NVRAM cards computer 102 of FIG. 1. After operation 522, process flow 500 moves to 528 where process flow 500 ends.

Operation 524 depicts determining whether the verifying whether the contents of the NVRAM match the saved file passes. This can comprise determining whether the comparison made in operation 520 indicates that the data contents of volatile memory of the NVRAM card the data of the file of operation 504.

Where it is determined in operation 524 that the verifying whether the contents of the NVRAM match the saved file passes, process flow 500 moves to operation 526. Instead, where it is determined in operation 524 that the verifying whether the contents of the NVRAM match the saved file failed, process flow 500 moves to operation 522.

Operation 526 is reached from operation 526 where it is determined that the verifying whether the contents of the NVRAM match the saved file passes. Operation 526 depicts marking the card as passing. This can comprise a remote I/O controller lighting up a light in a PCI expansion chassis that indicates that the card passed (e.g., a green light for passed, in contrast to a red light for failed).

In some examples, this can comprise storing an indication that the NVRAM card passed in a computer memory of validating multiple NVRAM cards computer 102 of FIG. 1. After operation 526, process flow 500 moves to 528 where process flow 500 ends.

Example Circuit Diagrams

Figure 6:
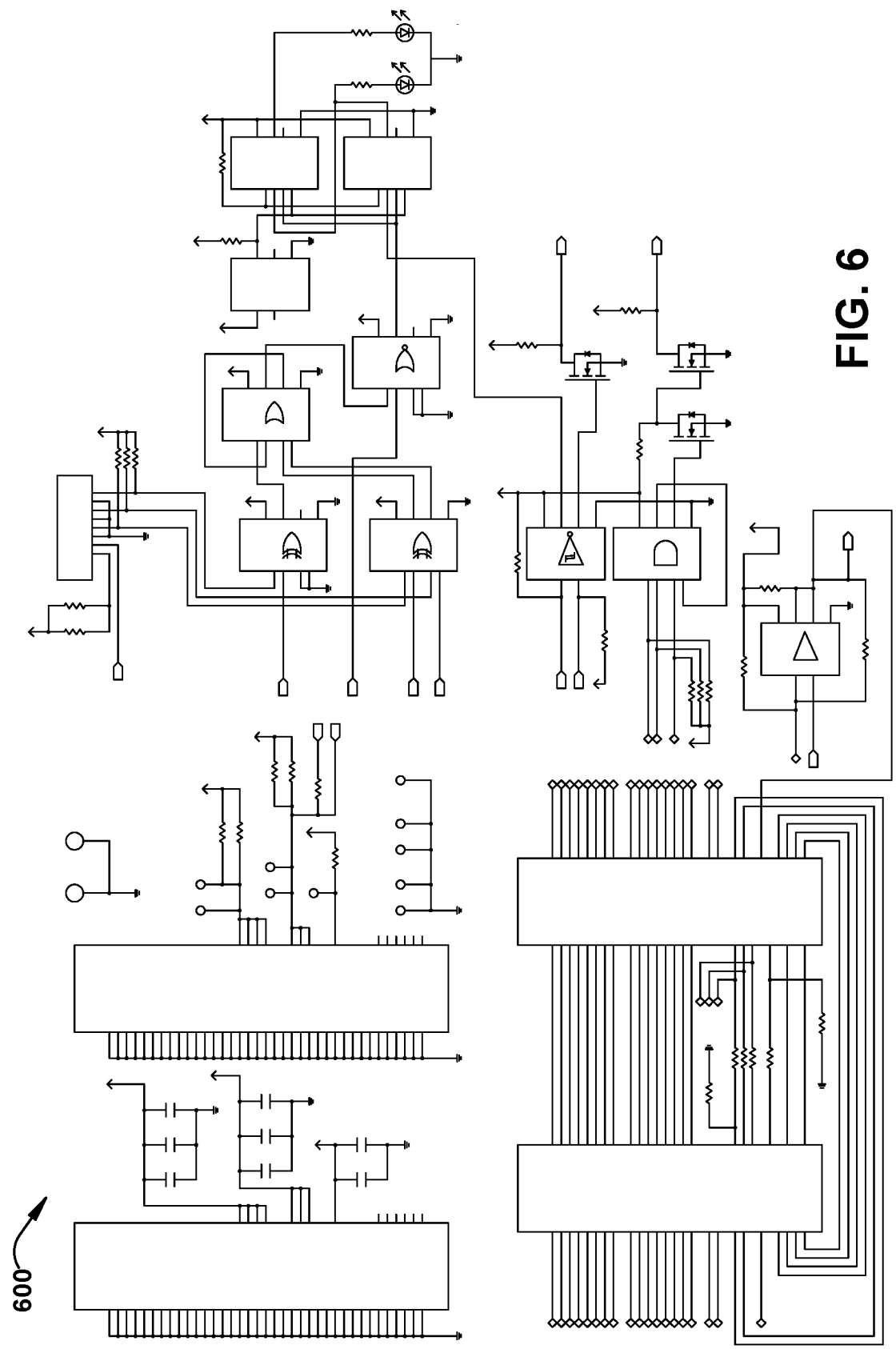
FIG. 6 illustrates an example circuit diagram for a device that can facilitate automated testing of functionality of multiple NVRAM cards, in accordance with an embodiment of this disclosure.

FIG. 6 illustrates an example circuit diagram 600 for a device that can facilitate automated testing of functionality of multiple NVRAM cards, in accordance with an embodiment of this disclosure. In some examples, parts of circuit diagram 600 can be used to implement parts of system architecture 100 of FIG. 1, such as PCI-e extender card 112-1, PCI-e extender card 112-2, and/or PCI-e extender card 112-N.

Figure 7:
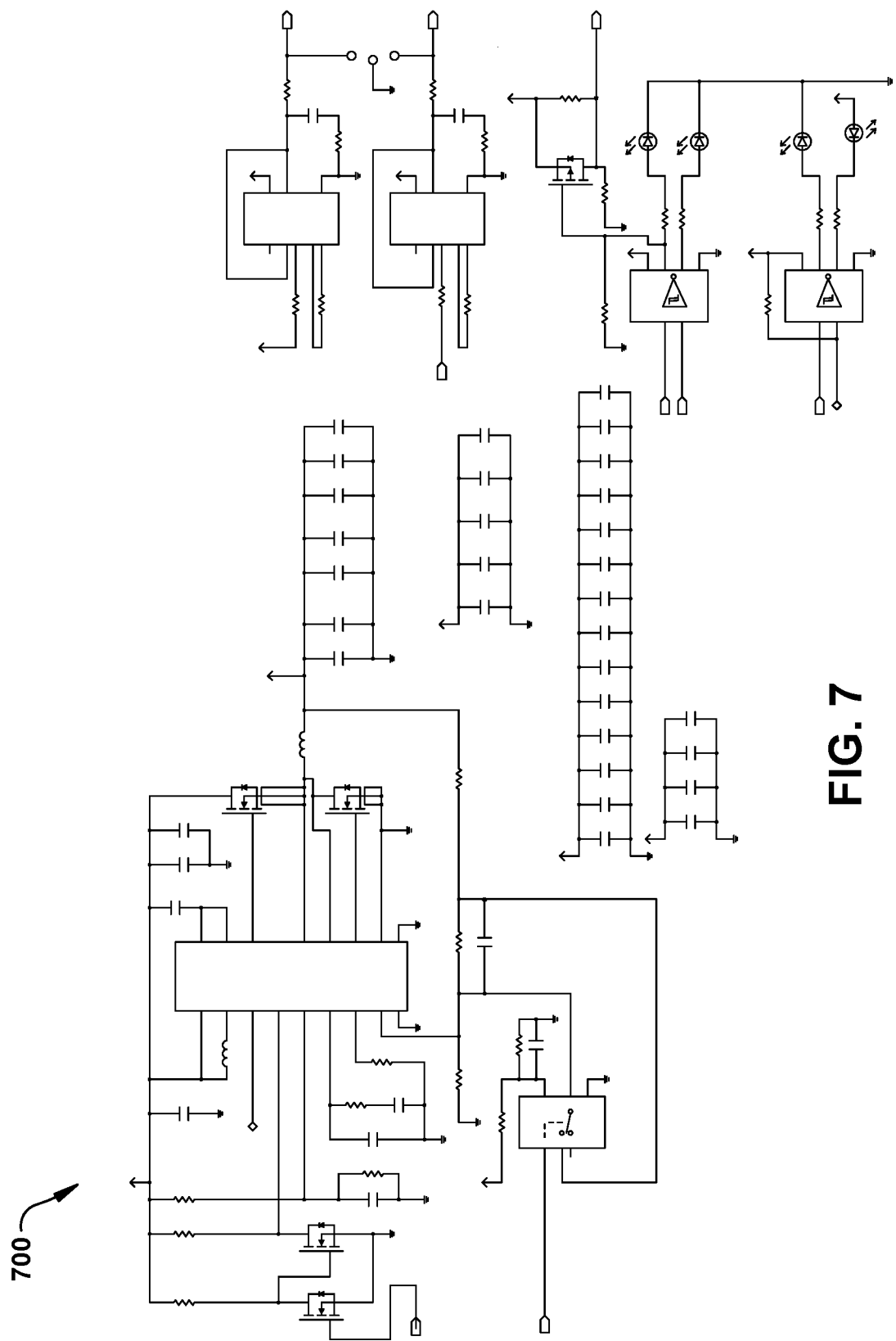
FIG. 7 illustrates another example circuit diagram for a device that can facilitate automated testing of functionality of multiple NVRAM cards, in accordance with an embodiment of this disclosure.

FIG. 7 illustrates another example circuit diagram 700 for a device that can facilitate automated testing of functionality of multiple NVRAM cards, in accordance with an embodiment of this disclosure. In some examples, parts of circuit diagram 700 can be used to implement parts of system architecture 100 of FIG. 1, such as PCI-e extender card 112-1, PCI-e extender card 112-2, and/or PCI-e extender card 112-N.

Figure 8:
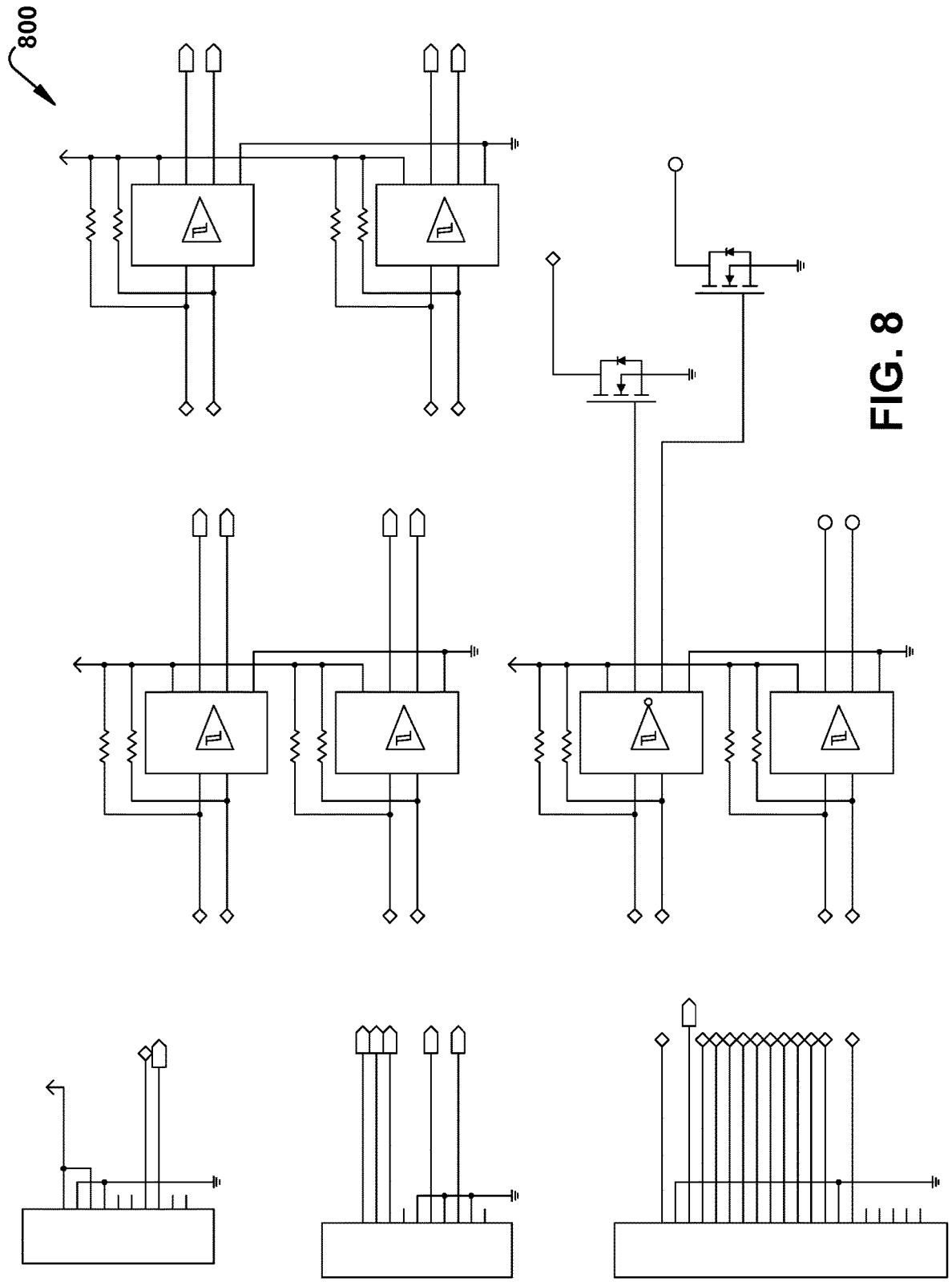
FIG. 8 illustrates another example circuit diagram for a device that can facilitate automated testing of functionality of multiple NVRAM cards, in accordance with an embodiment of this disclosure.

FIG. 8 illustrates another example circuit diagram 800 for a device that can facilitate automated testing of functionality of multiple NVRAM cards, in accordance with an embodiment of this disclosure. In some examples, parts of circuit diagram 800 can be used to implement parts of system architecture 100 of FIG. 1, such as PCI-e extender card 112-1, PCI-e extender card 112-2, and/or PCI-e extender card 112-N.

Example Process Flows

FIG. 9 illustrates an example process flow 900 for automated testing of functionality of multiple NVRAM cards, in accordance with an embodiment of this disclosure. In some examples, one or more embodiments of process flow 900 can be implemented by validating multiple NVRAM cards computer 102 of FIG. 1, or computing environment 1200 of FIG. 12.

It can be appreciated that the operating procedures of process flow 900 are example operating procedures, and that there can be embodiments that implement more or fewer operating procedures than are depicted, or that implement the depicted operating procedures in a different order than as depicted. In some examples, process flow 900 can be implemented in conjunction with one or more embodiments of one or more of process flow 400 of FIG. 4, process flow 500 of FIG. 5, process flow 1000 of FIG. 10, and/or process flow 1100 of FIG. 11.

Process flow 900 begins with 902, and moves to operation 904. Operation 904 depicts writing a first data to a first volatile memory of a first NVRAM device concurrently with writing the first data to a second volatile memory of a second NVRAM device. That is, one operation can be made to write the first data to the first volatile memory of the first NVRAM device while a second operation can be made to write the first data to a second volatile memory of a second NVRAM device.

In some examples, operation 904 comprises writing random data to a file that is stored external to the first NVRAM device and the second NVRAM device before performing the modifying of the first electrical voltage of the first NVRAM device, and performing the verifying of whether the first NVRAM device stores the first data in volatile memory subsequent to performing the resetting based on comparing the first data to the file. That is, random data can be written to a file, and this file can be compared to the data stored in an NVRAM card after vault and restore operations to verify that the NVRAM card is functioning correctly.

After operation 904, process flow 900 moves to operation 906.

Operation 906 depicts modifying a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to nonvolatile storage. That is, one power supply can supply power to both the first NVRAM device and the second NVRAM device. By margining this one power supply, the power provided to both the first NVRAM device and the second NVRAM device can be modified.

In some examples, the first value of the voltage is in a range of 4.75-5.25 volts. This can be an initial operating voltage of a NVRAM device.

In some examples, the second value of the voltage is in a range of 2.945-3.255 volts. This can be a margin voltage for a NVRAM device.

In some examples, operation 906 comprises, after decreasing the voltage from the second value to a third value, determining that the first NVRAM device has completed the storing of the first data from the first volatile memory to the first nonvolatile storage. In some examples, the third value of the voltage is in a range of 2.375-2.625 volts. That is, a drop from approximately 3.3 volts to approximately 2.5 volts can be performed before determining whether a vault operation has completed.

In some examples, operation 906 comprises verifying that the voltage has been decreased from the second value to the third value based on utilizing a remote input/output operation on the first NVRAM device. That is, remote I/O operations can be utilized to verify that a voltage has dropped to approximately 2.5 volts.

After operation 906, process flow 900 moves to operation 908.

Operation 908 depicts resetting the first electrical power source, causing the first NVRAM device and the second NVRAM device to reset. Where one power supply provides power to both the first NVRAM device and the second NVRAM device, power cycling this one power supply can cause both the first NVRAM device and the second NVRAM device to reset.

After operation 908, process flow 900 moves to operation 910.

Operation 910 depicts verifying whether the first NVRAM device stores the first data in volatile memory subsequent to performing the resetting concurrently with verifying whether the second NVRAM device stores the first data in volatile memory subsequent to performing the resetting. That is, one operation can be made to verify the first NVRAM device while a second operation can be made to verify the second NVRAM device.

After operation 910, process flow 900 moves to 912, where process flow 900 ends.

FIG. 10 illustrates another example process flow 1000 for automated testing of functionality of multiple NVRAM cards, in accordance with an embodiment of this disclosure. In some examples, one or more embodiments of process flow 1000 can be implemented by validating multiple NVRAM cards computer 102 of FIG. 1, or computing environment 1200 of FIG. 12.

It can be appreciated that the operating procedures of process flow 1000 are example operating procedures, and that there can be embodiments that implement more or fewer operating procedures than are depicted, or that implement the depicted operating procedures in a different order than as depicted. In some examples, process flow 1000 can be implemented in conjunction with one or more embodiments of one or more of process flow 400 of FIG. 4, process flow 500 of FIG. 5, process flow 900 of FIG. 9, and/or process flow 1100 of FIG. 11.

Process flow 1000 begins with 1002, and moves to operation 1004. Operation 1004 depicts writing data to a first volatile memory of a first nonvolatile random-access memory (NVRAM) device in parallel with writing the data to a second volatile memory of a second NVRAM device. In some examples, operation 1004 can be implemented in a similar manner as operation 904 of FIG. 9.

In some examples, operation 1004 comprises programming a first firmware of the first NVRAM device and a second firmware of a second NVRAM device before performing the writing of the data to the first volatile memory of the data to the first NVRAM device. That is, a firmware of a NVRAM device can be programmed before the NVRAM device is tested.

In some examples, operation 1004 comprises setting the first NVRAM device and the second NVRAM device into a respective manufacturing mode using a remote input/output operation via a digital output signal of a remote input/output controller before performing the programming That is, a NVRAM device can be set into a manufacturing mode (e.g., a MFG mode) before its firmware is programmed After operation 1004, process flow 1000 moves to operation 1006.

Operation 1006 depicts modifying a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to a nonvolatile storage. In some examples, operation 1006 can be implemented in a similar manner as operation 906 of FIG. 9.

After operation 1006, process flow 1000 moves to operation 1008.

Operation 1008 depicts resetting the first NVRAM device in parallel with resetting the second NVRAM device. In some examples, operation 1008 can be implemented in a similar manner as operation 908 of FIG. 9.

In some examples, operation 1008 comprises resetting a hardware device that connects the first NVRAM device and the second NVRAM device to the electrical power source. That is, one or more NVRAM devices can be reset by resetting a test head that the NVRAM devices are coupled to, and that supplies power to the NVRAM devices.

In some examples, operation 1008 comprises polling a digital input signal from the first NVRAM device that is available after power is no longer supplied to the first NVRAM device to determine that the first NVRAM device has completed storing the data from the first volatile memory to the first nonvolatile storage, and doing so before resetting the first NVRAM device. That is, it can be determined that the NVRAM device has completed a vault operation before resetting it.

After operation 1008, process flow 1000 moves to operation 1010.

Operation 1010 depicts verifying, by the system, whether the first NVRAM device stores the data in volatile memory subsequent to performing the resetting in parallel with verifying whether the second NVRAM device stores the data in volatile memory subsequent to performing the resetting. In some examples, operation 1010 can be implemented in a similar manner as operation 910 of FIG. 9.

In some examples, operation 1010 comprises determining that the first NVRAM device stores the data where the data matches a version of the data as stored in a memory external to the first NVRAM device. That is, in this example, the contents of the NVRAM device can be determined to match the saved file, so the NVRAM device can be considered to pass the test.

In some examples, operation 1010 comprises determining that the first NVRAM device does not store the data where the data does not match a version of the data as stored in a memory external to the first NVRAM device. That is, in this example, the contents of the NVRAM device can be determined not to match the saved file, so the NVRAM device can be considered to pass the test.

After operation 1010, process flow 1000 moves to 1012, where process flow 1000 ends.

FIG. 11 illustrates another example process flow 1100 for automated testing of functionality of multiple NVRAM cards, in accordance with an embodiment of this disclosure. In some examples, one or more embodiments of process flow 1100 can be implemented by validating multiple NVRAM cards computer 102 of FIG. 1, or computing environment 1200 of FIG. 12.

It can be appreciated that the operating procedures of process flow 1100 are example operating procedures, and that there can be embodiments that implement more or fewer operating procedures than are depicted, or that implement the depicted operating procedures in a different order than as depicted. In some examples, process flow 1100 can be implemented in conjunction with one or more embodiments of one or more of process flow 400 of FIG. 4, process flow 500 of FIG. 5, process flow 900 of FIG. 9, and/or process flow 1000 of FIG. 10.

Process flow 1000 begins with 1002, and moves to operation 1004. Operation 1104 depicts writing a data to a first volatile memory of a first NVRAM device in parallel with writing the data to a second volatile memory of a second NVRAM device. In some examples, operation 1104 can be implemented in a similar manner as operation 904 of FIG. 9.

In some examples, operation 1104 comprises programming a firmware of the first NVRAM device before performing the writing of the data to the first volatile memory of the first NVRAM device. In some examples, operation 1104 comprises using a first board present signal from a first remote input/output operation of the first NVRAM device to determine to perform the programming of the firmware. That is, where there are multiple NVRAM cards (or multiple slots for NVRAM cards), such as in a PCI expansion chassis, a determination of which cards to program can be made based on each card providing a board present signal to a remote I/O controller.

In some examples, operation 1104 comprises using a second board present signal from a second remote input/output operation of the second NVRAM device to determine to program second firmware of the second NVRAM device serially with the using of the first board present signal from the first remote input/output operation of the first NVRAM device to determine to perform the programming of the first firmware. That is, the PCI-e slots of a PCI expansion chassis can be cycled through serially to evaluate respective board present signals from NVRAM cards.

After operation 1104, process flow 1100 moves to operation 1106.

Operation 1106 depicts modifying a first electrical power source that provides an electrical power output that is received by the first NVRAM device and is received by the second NVRAM device to set a first margin voltage of the electrical power to initiate the first NVRAM device and the second NVRAM device to respectively store the first data from the first volatile memory to a nonvolatile storage. In some examples, operation 1106 can be implemented in a similar manner as operation 906 of FIG. 9.

After operation 1106, process flow 1100 moves to operation 1108.

Operation 1108 depicts resetting the first NVRAM device in parallel with resetting the second NVRAM device. In some examples, operation 1108 can be implemented in a similar manner as operation 908 of FIG. 9.

After operation 1108, process flow 1100 moves to operation 1110.

Operation 1110 depicts verifying whether the first NVRAM device has restored first data associated with the first NVRAM device from the first vault operation subsequent to performing the resetting in parallel with verifying whether the second NVRAM device has restored second data associated with the second NVRAM device from the second vault operation. In some examples, operation 1010 can be implemented in a similar manner as operation 910 of FIG. 9.

In some examples, operation 1110 comprises determining that verification is successful where the first NVRAM device indicates a status indicative of a success of vaulting and restoring. That is, the NVRAM device can convey a status via an output signal from the NVRAM device that conveys that it successfully completed vault and restore operations. In some examples, operations can be performed to verify that the data stored in the NVRAM device after the vault and restore operations is the data that was originally written to the NVRAM device.

In some examples, operation 1110 comprises determining that verification is unsuccessful where the first NVRAM device indicates a status indicative of a failure of vaulting and restoring. That is, the NVRAM device can convey a status via an output signal from the NVRAM device that conveys that it was unsuccessful in completing vault and restore operations.

After operation 1110, process flow 1100 moves to 1112, where process flow 1100 ends.

Example Operating Environment

In order to provide additional context for various embodiments described herein, FIG. 12 and the following discussion are intended to provide a brief, general description of a suitable computing environment 1200 in which the various embodiments of the embodiment described herein can be implemented.

For example, parts of computing environment 1200 can be used to implement one or more embodiments of validating multiple NVRAM cards computer 102, remote I/O controller 108, PCI-e expansion chassis 110, PCI-e extender card 112-1, PCI-e extender card 112-2, PCI-e extender card 112-N, NVRAM card 114-1, NVRAM card 114-2, and/or NVRAM card 114-N of FIG. 1; remote I/O device 202, remote I/O device 204, remote I/O device 206a, remote I/O device 206b, PCI-e expansion chassis 210, PCI-e extender cards 212, NVRAM cards 214, and/or validating multiple NVRAM cards computer 216 of FIG. 2; and/or validating multiple NVRAM cards computer 302 and/or NVRAM card 304 of FIG. 3.

In some examples, computing environment 1200 can implement one or more embodiments of the process flows of FIGS. 4-5 and/or 9-11 to facilitate automated testing of functionality of multiple NVRAM cards.

While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the various methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 12, the example environment 1200 for implementing various embodiments described herein includes a computer 1202, the computer 1202 including a processing unit 1204, a system memory 1206 and a system bus 1208. The system bus 1208 couples system components including, but not limited to, the system memory 1206 to the processing unit 1204. The processing unit 1204 can be any of various commercially available processors. Dual microprocessors and other multi-processor architectures can also be employed as the processing unit 1204.

The system bus 1208 can be any of several types of bus structure that can further interconnect to a memory bus (with or without a memory controller), a peripheral bus, and a local bus using any of a variety of commercially available bus architectures. The system memory 1206 includes ROM 1210 and RAM 1212. A basic input/output system (BIOS) can be stored in a nonvolatile memory such as ROM, erasable programmable read only memory (EPROM), EEPROM, which BIOS contains the basic routines that help to transfer information between elements within the computer 1202, such as during startup. The RAM 1212 can also include a high-speed RAM such as static RAM for caching data.

The computer 1202 further includes an internal hard disk drive (HDD) 1214 (e.g., EIDE, SATA), one or more external storage devices 1216 (e.g., a magnetic floppy disk drive (FDD) 1216, a memory stick or flash drive reader, a memory card reader, etc.) and an optical disk drive 1220 (e.g., which can read or write from a CD-ROM disc, a DVD, a BD, etc.). While the internal HDD 1214 is illustrated as located within the computer 1202, the internal HDD 1214 can also be configured for external use in a suitable chassis (not shown). Additionally, while not shown in environment 1200, a solid state drive (SSD) could be used in addition to, or in place of, an HDD 1214. The HDD 1214, external storage device(s) 1216 and optical disk drive 1220 can be connected to the system bus 1208 by an HDD interface 1224, an external storage interface 1226 and an optical drive interface 1228, respectively. The interface 1224 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1202, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1212, including an operating system 1230, one or more application programs 1232, other program modules 1234 and program data 1236. All or portions of the operating system, applications, modules, and/or data can also be cached in the RAM 1212. The systems and methods described herein can be implemented utilizing various commercially available operating systems or combinations of operating systems.

Computer 1202 can optionally comprise emulation technologies. For example, a hypervisor (not shown) or other intermediary can emulate a hardware environment for operating system 1230, and the emulated hardware can optionally be different from the hardware illustrated in FIG. 12. In such an embodiment, operating system 1230 can comprise one virtual machine (VM) of multiple VMs hosted at computer 1202. Furthermore, operating system 1230 can provide runtime environments, such as the Java runtime environment or the .NET framework, for applications 1232. Runtime environments are consistent execution environments that allow applications 1232 to run on any operating system that includes the runtime environment. Similarly, operating system 1230 can support containers, and applications 1232 can be in the form of containers, which are lightweight, standalone, executable packages of software that include, e.g., code, runtime, system tools, system libraries and settings for an application.

Further, computer 1102 can be enabled with a security module, such as a trusted processing module (TPM). For instance, with a TPM, boot components hash next in time boot components, and wait for a match of results to secured values, before loading a next boot component. This process can take place at any layer in the code execution stack of computer 1102, e.g., applied at the application execution level or at the operating system (OS) kernel level, thereby enabling security at any level of code execution.

A user can enter commands and information into the computer 1202 through one or more wired/wireless input devices, e.g., a keyboard 1238, a touch screen 1240, and a pointing device, such as a mouse 1242. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1204 through an input device interface 1244 that can be coupled to the system bus 1208, but can be connected by other interfaces, such as a parallel port, an IEEE 1394 serial port, a game port, a USB port, an IR interface, a BLUETOOTH® interface, etc.

A monitor 1246 or other type of display device can be also connected to the system bus 1208 via an interface, such as a video adapter 1248. In addition to the monitor 1246, a computer typically includes other peripheral output devices (not shown), such as speakers, printers, etc.

The computer 1202 can operate in a networked environment using logical connections via wired and/or wireless communications to one or more remote computers, such as a remote computer(s) 1250. The remote computer(s) 1250 can be a workstation, a server computer, a router, a personal computer, portable computer, microprocessor-based entertainment appliance, a peer device or other common network node, and typically includes many or all of the elements described relative to the computer 1202, although, for purposes of brevity, only a memory/storage device 1252 is illustrated. The logical connections depicted include wired/wireless connectivity to a local area network (LAN) 1254 and/or larger networks, e.g., a wide area network (WAN) 1256. Such LAN and WAN networking environments are commonplace in offices and companies, and facilitate enterprise-wide computer networks, such as intranets, all of which can connect to a global communications network, e.g., the Internet.

When used in a LAN networking environment, the computer 1202 can be connected to the local network 1254 through a wired and/or wireless communication network interface or adapter 1258. The adapter 1258 can facilitate wired or wireless communication to the LAN 1254, which can also include a wireless access point (AP) disposed thereon for communicating with the adapter 1258 in a wireless mode.

When used in a WAN networking environment, the computer 1102 can include a modem 1160 or can be connected to a communications server on the WAN 1156 via other means for establishing communications over the WAN 1156, such as by way of the Internet. The modem 1160, which can be internal or external and a wired or wireless device, can be connected to the system bus 1108 via the input device interface 1144. In a networked environment, program modules depicted relative to the computer 1102 or portions thereof, can be stored in the remote memory/storage device 1152. It will be appreciated that the network connections shown are examples and other means of establishing a communications link between the computers can be used.

When used in either a LAN or WAN networking environment, the computer 1202 can access cloud storage systems or other network-based storage systems in addition to, or in place of, external storage devices 1216 as described above. Generally, a connection between the computer 1202 and a cloud storage system can be established over a LAN 1254 or WAN 1256 e.g., by the adapter 1258 or modem 1260, respectively. Upon connecting the computer 1202 to an associated cloud storage system, the external storage interface 1226 can, with the aid of the adapter 1258 and/or modem 1260, manage storage provided by the cloud storage system as it would other types of external storage. For instance, the external storage interface 1226 can be configured to provide access to cloud storage sources as if those sources were physically connected to the computer 1202.

The computer 1202 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

CONCLUSION

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory in a single machine or multiple machines. Additionally, a processor can refer to an integrated circuit, a state machine, an application specific integrated circuit (ASIC), a digital signal processor (DSP), a programmable gate array (PGA) including a field programmable gate array (FPGA), a programmable logic controller (PLC), a complex programmable logic device (CPLD), a discrete gate or transistor logic, discrete hardware components, or any combination thereof designed to perform the functions described herein. Processors can exploit nano-scale architectures such as, but not limited to, molecular and quantum-dot based transistors, switches and gates, in order to optimize space usage or enhance performance of user equipment. A processor may also be implemented as a combination of computing processing units. One or more processors can be utilized in supporting a virtualized computing environment. The virtualized computing environment may support one or more virtual machines representing computers, servers, or other computing devices. In such virtualized virtual machines, components such as processors and storage devices may be virtualized or logically represented. For instance, when a processor executes instructions to perform "operations", this could include the processor performing the operations directly and/or facilitating, directing, or cooperating with another device or component to perform the operations.

In the subject specification, terms such as "data store," "data storage," "database," "cache," and substantially any other information storage component relevant to operation and functionality of a component, refer to "memory components," or entities embodied in a "memory" or components comprising the memory. It will be appreciated that the memory components, or computer-readable storage media, described herein can be either volatile memory or nonvolatile memory, or can include both volatile and nonvolatile memory. By way of illustration, and not limitation, nonvolatile memory can include ROM, programmable ROM (PROM), EPROM, EEPROM, or flash memory. Volatile memory can include RAM, which acts as external cache memory. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

The illustrated embodiments of the disclosure can be practiced in distributed computing environments where certain tasks are performed by remote processing devices that are linked through a communications network. In a distributed computing environment, program modules can be located in both local and remote memory storage devices.

The systems and processes described above can be embodied within hardware, such as a single integrated circuit (IC) chip, multiple ICs, an ASIC, or the like. Further, the order in which some or all of the process blocks appear in each process should not be deemed limiting. Rather, it should be understood that some of the process blocks can be executed in a variety of orders that are not all of which may be explicitly illustrated herein.

As used in this application, the terms "component," "module," "system," "interface," "cluster," "server," "node," or the like are generally intended to refer to a computer-related entity, either hardware, a combination of hardware and software, software, or software in execution or an entity related to an operational machine with one or more specific functionalities. For example, a component can be, but is not limited to being, a process running on a processor, a processor, an object, an executable, a thread of execution, computer-executable instruction(s), a program, and/or a computer. By way of illustration, both an application running on a controller and the controller can be a component. One or more components may reside within a process and/or thread of execution and a component may be localized on one computer and/or distributed between two or more computers. As another example, an interface can include input/output (I/O) components as well as associated processor, application, and/or API components.

Further, the various embodiments can be implemented as a method, apparatus, or article of manufacture using standard programming and/or engineering techniques to produce software, firmware, hardware, or any combination thereof to control a computer to implement one or more embodiments of the disclosed subject matter. An article of manufacture can encompass a computer program accessible from any computer-readable device or computer-readable storage/communications media. For example, computer readable storage media can include but are not limited to magnetic storage devices (e.g., hard disk, floppy disk, magnetic strips . . . ), optical discs (e.g., CD, DVD . . . ), smart cards, and flash memory devices (e.g., card, stick, key drive . . . ). Of course, those skilled in the art will recognize many modifications can be made to this configuration without departing from the scope or spirit of the various embodiments.

In addition, the word "example" or "exemplary" is used herein to mean serving as an example, instance, or illustration. Any embodiment or design described herein as "exemplary" is not necessarily to be construed as preferred or advantageous over other embodiments or designs. Rather, use of the word exemplary is intended to present concepts in a concrete fashion. As used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What has been described above includes examples of the present specification. It is, of course, not possible to describe every conceivable combination of components or methods for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system, comprising:
   a processor; and
   a memory that stores executable instructions that, when executed by the processor, facilitate performance of operations, comprising:
      writing a first data to a first volatile memory of a first nonvolatile random-access memory (NVRAM) device concurrently with writing the first data to a second volatile memory of a second NVRAM device;
      modifying a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to a nonvolatile storage and store the data from the second volatile memory to a second nonvolatile storage;
      resetting the first electrical power source, causing the first NVRAM device and the second NVRAM device to reset; and
      verifying whether the first NVRAM device stores the first data in the first volatile memory subsequent to performing the resetting of the first electrical power source concurrently with verifying whether the second NVRAM device stores the first data in the second volatile memory subsequent to performing the resetting of the first electrical power source.

2. The system of claim 1, wherein the operations further comprise:
   writing random data to a file that is stored external to the first NVRAM device and the second NVRAM device before performing the modifying of the voltage of the first NVRAM device; and
   performing the verifying of whether the first NVRAM device stores the first data in the first volatile memory subsequent to performing the resetting of the first electrical power source based on comparing the first data to the file.

3. The system of claim 1, wherein the first value of the voltage is in a range of 4.75-5.25 volts.

4. The system of claim 3, wherein the second value of the voltage is in a range of 2.945-3.255 volts.

5. The system of claim 1, wherein the operations further comprise:
   after decreasing the voltage from the second value to a third value, determining that the first NVRAM device has completed the storing of the first data from the first volatile memory to the first nonvolatile storage.

6. The system of claim 5, wherein the third value of the voltage is in a range of 2.375-2.625 volts.

7. The system of claim 5, wherein the operations further comprise:
   verifying that the voltage has been decreased from the second value to the third value based on utilizing a remote input/output operation on the first NVRAM device.

8. A method, comprising:
   writing, by a system comprising a processor, data to a first volatile memory of a first nonvolatile random-access memory (NVRAM) device in parallel with writing the data to a second volatile memory of a second NVRAM device;
   modifying, by the system, a first electrical power source that provides an electrical power output that is received by the first NVRAM device and is received by the second NVRAM device to modify a voltage of the electrical power from a first value to a second value to initiate the first NVRAM device and the second NVRAM device to respectively store the first data from the first volatile memory to a first nonvolatile storage of the first NVRAM device and store the data from the second volatile memory to a second nonvolatile storage of the second NVRAM device;
   resetting, by the system, the first NVRAM device in parallel with resetting the second NVRAM device; and
   verifying, by the system, whether the first NVRAM device stores the data in the first volatile memory subsequent to performing the resetting of the first NVRAM device and the second NVRAM device in parallel with verifying whether the second NVRAM device stores the data in the second volatile memory subsequent to performing the resetting of the first NVRAM device and the second NVRAM device.

9. The method of claim 8, wherein the resetting of the first NVRAM device in parallel with the resetting of the second NVRAM device comprises:
resetting, by the system, a hardware device that connects the first NVRAM device and the second NVRAM device to the electrical power source.

10. The method of claim 8, wherein the verifying of whether the first NVRAM device stores the data in the first volatile memory subsequent to performing the resetting of the first NVRAM device comprises:
determining, by the system, that the first NVRAM device stores the data where the data matches a version of the data as stored in a memory external to the first NVRAM device.

11. The method of claim 8, wherein the verifying of whether the first NVRAM device stores the data in the first volatile memory subsequent to performing the resetting of the first NVRAM device comprises:
determining, by the system, that the first NVRAM device does not store the data where the data does not match a version of the data as stored in a memory external to the first NVRAM device.

12. The method of claim 8, further comprising;
polling, by the system, a digital input signal from the first NVRAM device that is available after power is no longer supplied to the first NVRAM device to determine that the first NVRAM device has completed storing the data from the first volatile memory to the first nonvolatile storage.

13. The method of claim 8, further comprising:
programming, by the system, a first firmware of the first NVRAM device and a second firmware of a second NVRAM device before performing the writing of the data to the first volatile memory of the first NVRAM device.

14. The method of claim 13, further comprising:
setting, by the system, the first NVRAM device and the second NVRAM device into a respective manufacturing mode using a remote input/output operation via a digital output signal of a remote input/output controller before performing the programming.

15. A non-transitory computer-readable medium comprising instructions that, in response to execution, cause a system comprising a processor to perform operations, comprising:
writing a data to a first volatile memory of a first nonvolatile random-access memory (NVRAM) device to produce a first data, in parallel with writing the data to a second volatile memory of a second NVRAM device to produce a second data;
modifying a first electrical power source that provides an electrical power output that is received by the first NVRAM device and is received by the second NVRAM device to set a first margin voltage of the electrical power to initiate the first NVRAM device and the second NVRAM device to respectively store the first data from the first volatile memory to a first nonvolatile storage of the first NVRAM device and store the second data from the second volatile memory to a second nonvolatile storage of the second NVRAM device;
resetting the first NVRAM device in parallel with resetting the second NVRAM device; and
verifying whether the first NVRAM device has restored first data associated with the first NVRAM device to the first volatile memory subsequent to performing the resetting of the first NVRAM device in parallel with verifying whether the second NVRAM device has restored second data associated with the second NVRAM device to the second volatile memory.

16. The non-transitory computer-readable medium of claim 15, wherein the verifying whether the first NVRAM device has restored the first data comprises:
determining that verification is successful where the first NVRAM device indicates a status indicative of a success of vaulting and restoring.

17. The non-transitory computer-readable medium of claim 15, wherein the verifying whether the first NVRAM device has restored the first data comprises:
determining that verification is unsuccessful where the first NVRAM device indicates a status indicative of a failure of vaulting and restoring.

18. The non-transitory computer-readable medium of claim 15, wherein the operations further comprise:
programming a firmware of the first NVRAM device before performing the writing of the data to the first volatile memory of the first NVRAM device.

19. The non-transitory computer-readable medium of claim 18, wherein the operations further comprise:
using a first board present signal from a first remote input/output operation of the first NVRAM device to determine to perform the programming of the firmware.

20. The non-transitory computer-readable medium of claim 19, wherein the firmware is first firmware, and wherein the operations further comprise:
using a second board present signal from a second remote input/output operation of the second NVRAM device to determine to program second firmware of the second NVRAM device serially with the using of the first board present signal from the first remote input/output operation of the first NVRAM device to determine to perform the programming of the first firmware.

* * * * *